US006277504B1

(12) United States Patent
Koch et al.

(10) Patent No.: US 6,277,504 B1
(45) Date of Patent: Aug. 21, 2001

(54) EL ASSEMBLY BASED ON TERTIARY AMINES, ALQ$_3$ DERIVATIVES OR MIXTURES SOLUBLE IN ALCOHOL AND POLYMERIC BINDERS

(75) Inventors: Friedrich Koch, Walsrode; Helmut Werner Heuer; Rolf Wehrmann, both of Krefeld; Martin Deussen, Marburg; Andreas Elschner, Mülheim, all of (DE)

(73) Assignee: Bayer AG, Leverkusen (DE)

( * ) Notice: Subject to any disclaimer, the term of this patent is extended or adjusted under 35 U.S.C. 154(b) by 0 days.

(21) Appl. No.: 09/272,983

(22) Filed: Mar. 20, 1999

(30) Foreign Application Priority Data

Mar. 20, 1998 (DE) .............................. 198 12 259

(51) Int. Cl.$^7$ .................................. H05B 33/14
(52) U.S. Cl. .................. 428/690; 428/704; 428/917; 313/504; 313/506
(58) Field of Search ................... 428/690, 704, 428/917; 313/504, 506

(56) References Cited

U.S. PATENT DOCUMENTS

| | | | |
|---|---|---|---|
| 4,539,507 | 9/1985 | VanSlyke et al. | 313/504 |
| 4,769,262 | 9/1988 | Ferrar et al. | 428/35 |
| 4,923,774 | 5/1990 | Van der Auweraer et al. | 430/59 |
| 5,077,142 | 12/1991 | Sakon et al. | 428/690 |
| 5,150,006 | 9/1992 | Van Slyke et al. | 313/504 |
| 5,281,489 | * 1/1994 | Mori et al. | 428/690 |
| 5,456,988 | 10/1995 | Sano et al. | 428/690 |
| 5,487,953 | 1/1996 | Shirota et al. | 428/690 |

FOREIGN PATENT DOCUMENTS

| | | |
|---|---|---|
| 278 757 A2 | 8/1988 | (EP) . |
| 278 758 A2 | 8/1988 | (EP) . |
| WO 90/13148 | 11/1990 | (EP) . |
| 406 762 | 1/1991 | (EP) . |
| 443 861 A3 | 8/1991 | (EP) . |
| WO 92/16023 | 9/1992 | (EP) . |
| 532 798 A1 | 3/1993 | (EP) . |
| 686662 | 5/1994 | (EP) . |
| 731 625 | 2/1996 | (EP) . |
| WO 92/03490 | 3/1992 | (WO) . |
| WO 92/03491 | 3/1992 | (WO) . |
| WO 98/02018 | 1/1998 | (WO) . |

OTHER PUBLICATIONS

European Search Report (Jul. 15, 1999) for foreign counterpart application EP 99 10 9697.

J. Pommerehne, H. Vestweber, W. Guss, R. Mahrt, H. Bassler, M. Porsch, and J. Daub, Efficient Two Layer LEDs on a Polymer Blend Basis, *Advanced Materials* vol. 7, No. 6, pp. 551–554, (1995). No Month.

K. Naito and A. Miura, Molecular Design for Nonpolymeric Organic Dye Glasses with Thermal Stability: Relations between Thermodynamic Parameters and Amorphous Properties, *Journal of Physical Chemistry* vol. 97, pp. 6240–6248 (1993). No Month.

P. Burn, A. Holmes, A. Kraft, D. Bradley, A. Brown, and R. Friend, Synthesis of a Segmented Conjugated Polymer Chain Giving a Blue–Shifted Electroluminescence and Improved Efficiency, *J. Chem. Soc., Chem. Commun.*, pp. 32–34 (1992). No Month.

S. Tokito, T. Momii, H. Murata, T. Tsutsui, and S. Saito, Polyarylenevinylene Films Prepared from Precursor Polymers Soluble in Organic Solvents, *Polymer*, vol. 31, pp. 1137–1141, (Jun. 1990).

G. Grem, G. Leditzky, B. Ullrich, and G. Leising, Realization of a Blue–Light–Emitting Device Using Poly (p–phenylene), *Advanced Materials*, vol. 4, No. 1, pp. 36–37 (1992). No Month.

G. Johnson, K. McGrane, and M. Stolka, Electroluminescence from Single Layer Molecularly Doped Polymer Films, *Pure and Applied Chemistry*, vol. 67, No. 1, pp. 175–182(1995). No Month.

C. Adachi, K. Nagai, and N. Tamoto, Molecular Design of Hole Transport Materials for Obtaining High Durability in Orgainc Electroluminescent Diodes, *Appl. Phys. Lett.*, Vo.. 66 No. 20, pp. 2679–2681 (May 15, 1995).

(List continued on next page.)

*Primary Examiner*—Marie Yamnitzky
*Assistant Examiner*—Ling Xu
(74) *Attorney, Agent, or Firm*—Connolly Bove Lodge & Hutz LLP

(57) ABSTRACT

Electroluminescent assemblies containing a substrate, an anode, an electroluminescent element and a cathode, where at least one of the two electrodes is transparent in the visible spectral region and the electroluminescent element can contain in order: a hole injection zone, hole transport zone, electroluminescent zone, electron transport zone and/or an electron injection zone, characterized in that the hole injection and hole transport zone is a substituted or unsubstituted 1,3,5-tris(aminophenyl)benzene compound A or a mixture thereof and the electroluminescent element may, if desired, contain a further functionalized compound selected from the group consisting of hole transport materials, a luminescent material B and, if desired, electron transport materials, where the hole injection and hole transport zone can contain, in addition to the component A, one or more further hole transport compounds, where at least one zone is present, individual zones can be left out and the zone(s) present can assume a plurality of functions.

17 Claims, No Drawings

OTHER PUBLICATIONS

F. Ramaz, F. Madeore, J. Vial, S. Rand, A. Hachimi, and J. Margerie, *Pseudo–Stark Effect and Hole–Burning Spectroscopy of the 590–nm Center in $SrF_2:Na^{+Crystals,}$ Physical Review B*, vol. 47, No. 18, pp. 11.670–11.676 (May 1, 1993).

J. Kido, H. Shionoya, and K. Nagai, *Single–Layer White Light–Emitting Organic Electroluminescent Devices Based on Dye–Dispersed Poly (N–Vinylcarbazole), App. Phys. Lett*, vol. 67, No. 16, pp. 2381–2283 (Oct. 16, 1995).

Houben–Weyl, 4/1C, A. Katalytische Hydrierung, pp. 14–102. No. Date.

Ullmann, 4, Band 13, F. Brocker, Hydrierung und Dehydrierung, Katalytische,, Hydrierung und Dehydrierung, Katalytische, Band 13. No Date.

M. Matsumura and T. Akai, *Organic Electroluminescent Devices Having Derivatives of Aluminum–Hydroxyquinoline Complex as Light Emitting Materials* (Jul. 9, 1996), pp. 5357–5360.

T. Hopkins, K. Meerholz, S. Shaheen, M. Anderson, A. Schmidt, B. Kippelen, A. Padias, H. Hall, N. Peyghambarian, and N. Armstrong, *Substituted Aluminum and Zinc Quinolates with Blue–Shifted Absorbance/Luminescence Bands: Synthesis and Spectroscopic, Photoluminescence, and Electroluminescence Characterization*, (Nov. 20, 1995), pp. 344–351.

* cited by examiner

EL ASSEMBLY BASED ON TERTIARY AMINES, ALQ₃ DERIVATIVES OR MIXTURES SOLUBLE IN ALCOHOL AND POLYMERIC BINDERS

BACKGROUND OF THE INVENTION

1. Field of the Invention

An electroluminescent (EL) assembly is characterized in that it emits light on application of an electric potential with flow of electric current. Such assemblies have long been known in industry under the name light-emitting diodes (LEDs). The emission of light results from positive charges (holes) and negative charges (electrons) recombining with emission of light.

2. Description of the Prior Art

In the development of light-emitting components for electronics or optics, use is at present mainly made of inorganic semiconductors such as gallium arsenide. Display elements having a dot form can be produced on the basis of such substances. Large-area assemblies are not possible.

Apart from the semiconductor LEDs, electroluminescent assemblies based on vapour-deposited, low molecular weight organic compounds are known (U.S. Pat. Nos. 4,539,507, 4,769,262, 5,077,142, EP-A 406 762, EP-A 278 758, EP-A 278 757).

Furthermore, polymers such as poly-(p-phenylenes) and poly-(p-phenylene-vinylenes (PPV)) have been described as electroluminescent polymers: G. Leising et al., Adv. Mater. 4 (1992) No. 1; Friend et al., J. Chem. Soc., Chem. Commun. 32 (1992); Saito et al., Polymer, 1990, Vol. 31, 1137; Friend et al., Physical Review B, Vol. 42, No. 18, 11670 or WO-A 90/13148. Further examples of PPVs in electroluminesceiat displays are described in EP-A 443 861, WO-A 92/03490 and WO-A 92/003491.

Heeger et al. have proposed soluble conjugated PPV derivatives for producing flexible polymer LEDs (WO 92/16023).

Polymer blends of various compositions are likewise known: M. Stolka et al., Pure & Appl. Chem., Vol. 67, No. 1, pp 175–182, 1995; H. Bassler et al., Adv. Mater. 1995, 7, No. 6, 551; K. Nagai et al., Appl. Phys. Lett. 67 (16), 1995, 2281; EP-A 532 798.

The organic EL assemblies generally contain one or more layers of organic charge transport compounds. The in-principle structure in order of the layers is as follows:

1. Support, substrate
2. Base electrode
3. Hole injection layer
4. Hole transport layer
5. Light-emitting layer
6. Electron transport layer
7. Electron injection layer
8. Top electrode
9. Contacts
10. Sheathing, encapsulation Layers 3 to 7 represent the electroluminescent element. This structure constitutes the most general case and can be simplified by leaving out individual layers, so that one layer assumes a plurality of functions. In the simplest case, an EL assembly consists of two electrodes between which there is an organic layer which performs all functions including the emission of light. Such systems are described, for example, in the Application WO-A 90/13148 on the basis of poly-(p-phenylene-vinylene).

Multilayer systems can be built up by vapour deposition methods in which the layers are applied successively from the gas phase or by casting methods. Owing to the higher process speeds, casting processes are preferred. However, the partial dissolution of a layer which has already been applied when the next layer is applied on top can, in certain cases, be a difficulty.

U.S. Pat. Nos. 4,539,507 and 5,150,006 describe metal complexes based on 8-hydroxyquinoline derivatives having different central atoms, e.g. Zn, Al, Mg or Li, which function as emitter and electron injection and transport layers in an electroluminescence assembly. However, the compounds described have only a low solubility in alcohols so that they can be applied only by vapour deposition methods. If these compounds were applied from solvents such as THF or 1,2-dichloroethane, the previously applied hole conductor layer would be partially dissolved or the hole conductor could be leached from the polymer matrix.

The object of the present invention is to provide electroluminescent assemblies having a high light flux, where the mixture to be applied can be applied by casting. This applies to all of the hole injection, hole transport and electroluminescent or electron transport layers. In order that the application of the electroluminescent or electron transport layer does not result in partial dissolution of the layer underneath, the compounds used have to be soluble in alcohols, particularly in methanol. It was therefore necessary to synthesize specifically substituted metal complexes which have sufficient solubility in methanol for the casting process.

It has been found that electroluminescent assemblies which contain the blend system mentioned below and also the alcohol-soluble emitters or electron conductors (metal complexes) of the present invention meet these requirements. In the following, the term "zone" is equivalent to "layer".

SUMMARY OF THE INVENTION

The present invention accordingly provides electroluminescent assemblies containing a substrate, an anode, an electroluminescent element and a cathode, where at least one of the two electrodes is transparent in the visible spectral region and the electroluminescent element can contain, in order:

A hole injection zone, a hole transport zone, an electroluminescent zone, an electron transport zone and/or an electron injection zone, characterized in that the hole injection and/or hole transport zone is a substituted or unsubstituted 1,3,5-tris(aminophenyl)benzene compound A or a mixture thereof and the electroluminescent element contains, if desired, a further functionalized compound selected from the group consisting of hole transport materials, a luminescent material B and, if desired, electron transport materials, where the hole injection and hole transport zone can contain, apart from the component A, one or more further hole transport compounds, where at least one zone is present, individual zones can be left out and the zone(s) present can assume a plurality of functions.

One zone can assume a plurality of functions, i.e. one zone can contain, for example, hole injection, hole transport, electroluminescent, electron injection and/or electron transport substances.

The electroluminescent element can also contain one or more transparent polymeric binders C.

DESCRIPTION OF THE PREFERRED EMBODIMENTS

The substituted or unsubstituted 1,3,5-tris(aminophenyl) benzene compound A represents an aromatic tertiary amino compound of the general formula (I)

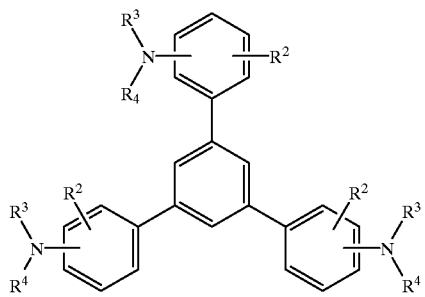

(I)

where $R^2$ represents hydrogen, substituted or unsubstituted alkyl or halogen, $R^3$ and $R^4$ represent, independently of one another, substituted or unsubstituted ($C_1$–$C_{10}$)-alkyl, alkoxycarbonyl-substituted ($C_1$–$C_{10}$)-alkyl or in each case substituted or unsubstituted aryl, aralkyl or cycloalkyl.

$R^3$ and $R^4$ preferably represent, independently of one another, ($C_1$–$C_6$)-alkyl, in particular methyl, ethyl, n- or iso-propyl, n-, iso-, sec- or tert-butyl, ($C_1$–$C_4$)-alkoxycarbonyl-($C_1$–$C_6$)-alkyl, for example methoxy-, ethoxy-, propoxy-, butoxy-carbonyl-($C_1$–$C_4$)-alkyl, or, in each case unsubstituted or substituted by ($C_1$–$C_4$)-alkyl and/or ($C_1$–$C_4$)-alkoxy, phenyl-($C_1$–$C_4$)-alkyl, naphthyl-($C_1$–$C_4$)-alkyl, cyclopentyl, cyclohexyl, phenyl or naphthyl.

$R^3$ and $R^4$ particularly preferably represent, independently of one another, unsubstituted phenyl or naphthyl, or phenyl or naphthyl bearing, in each case, from one to three methyl, ethyl, n- or iso-propyl, methoxy, ethoxy, n- and/or iso-propoxy substituents.

$R^2$ preferably represents hydrogen, ($C_1$–$C_6$)-alkyl, such as methyl, ethyl, n- or iso-propyl, n-, iso-, sec- or tert-butyl, or chlorine.

Such compounds and their preparation are described in U.S. Pat. No. 4,923,774 for use in electrophotography; this reference is hereby expressly incorporated by reference into the present description. The tris-nitrophenyl compound can be converted into the tris-aminophenyl compound by, for example, generally known catalytic hydrogenation, for example in the presence of Raney nickel (Houben-Weyl 4/1C, 14-102, Ullmamn (4) 13, 135–148). The amino compound is reacted with substituted halogenobenzenes in a generally known manner.

Mention may be made by way of example of the following compounds, where the substitution on the phenyl ring may take place in the ortho, meta and/or para position to the amine nitrogen:

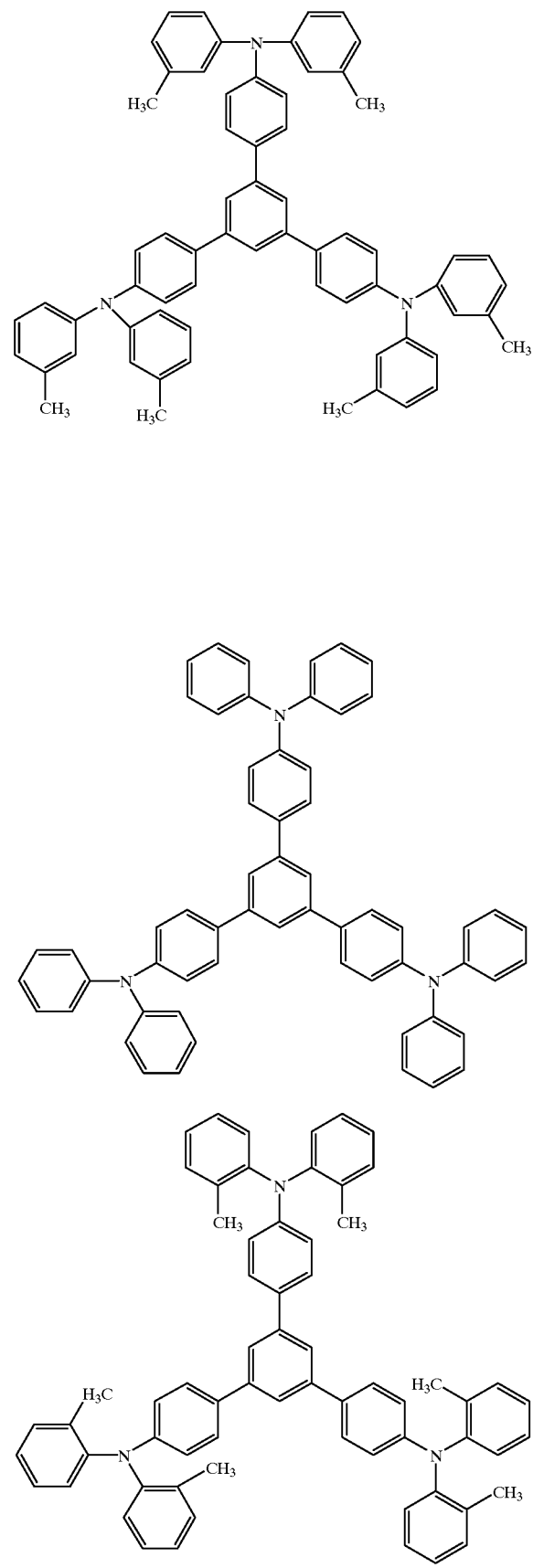

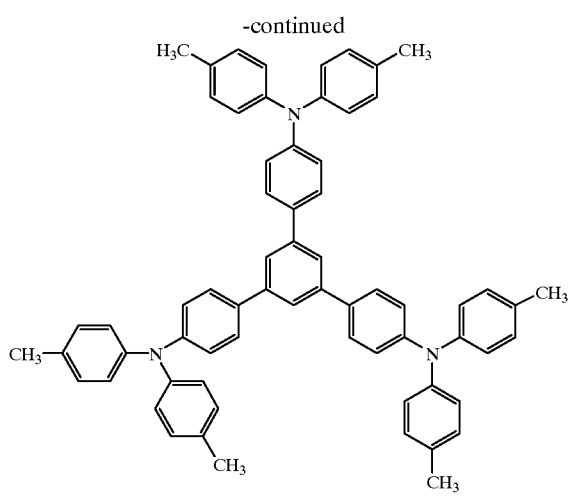
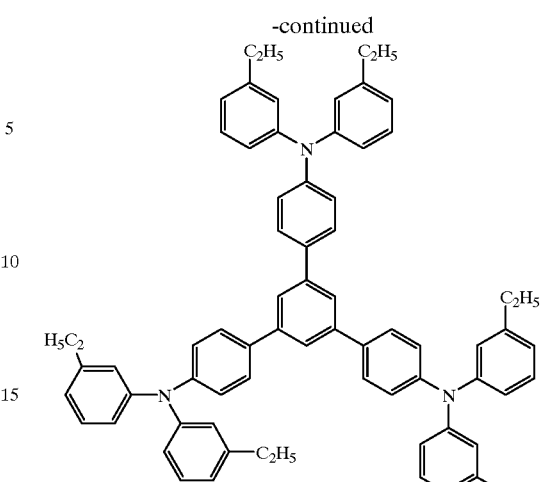
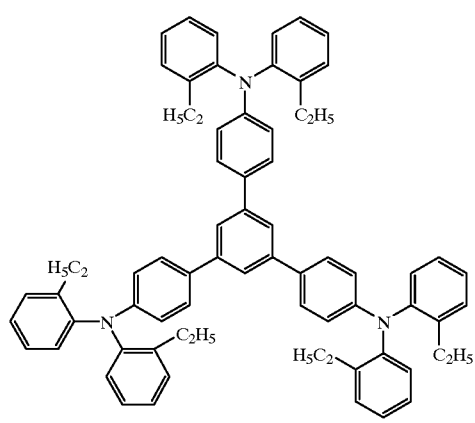
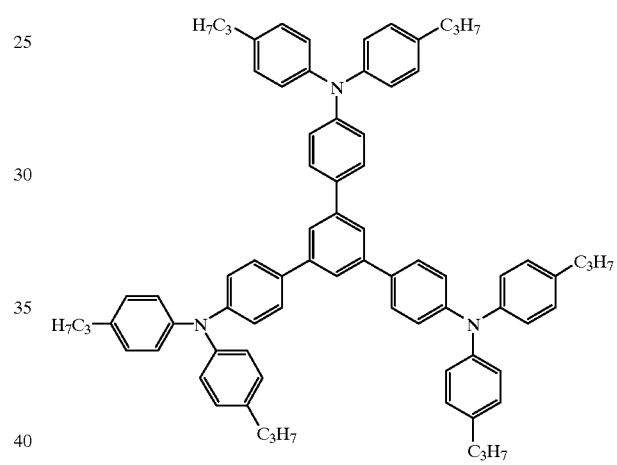
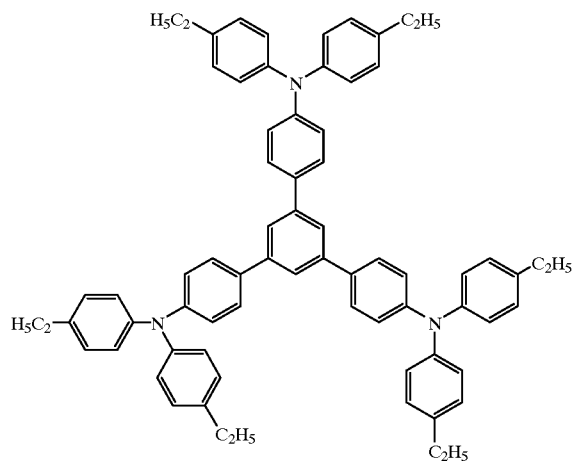
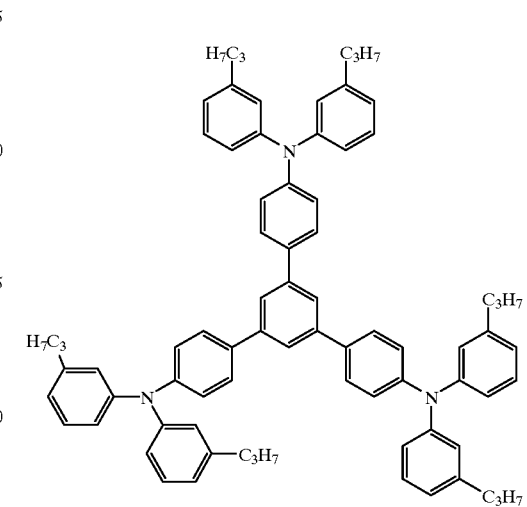

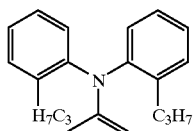
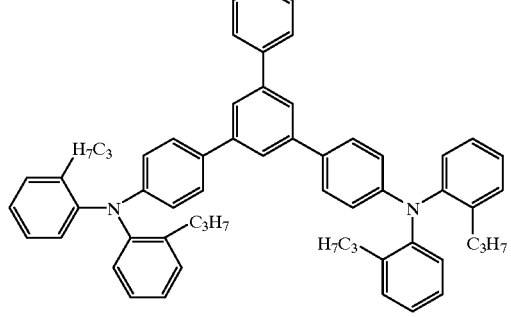
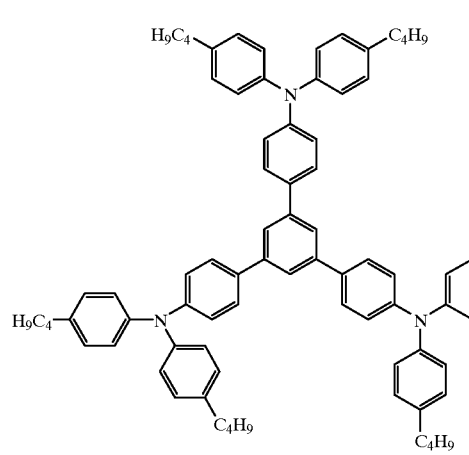
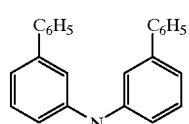
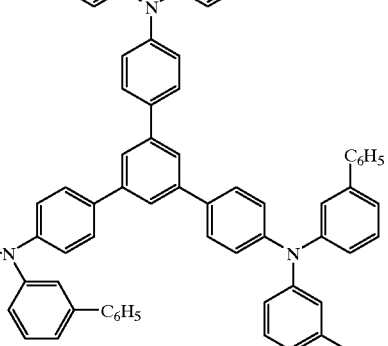
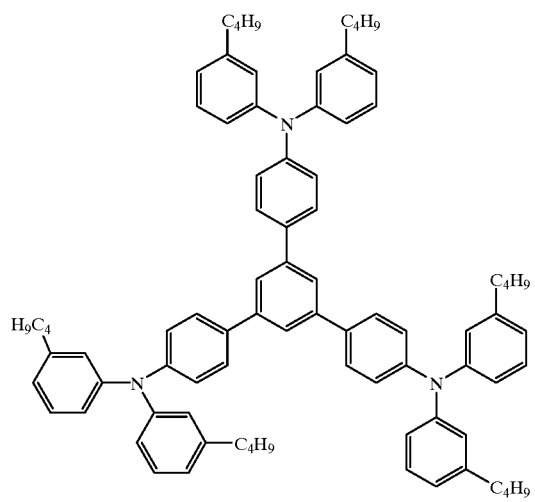
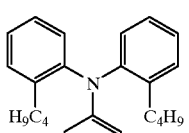
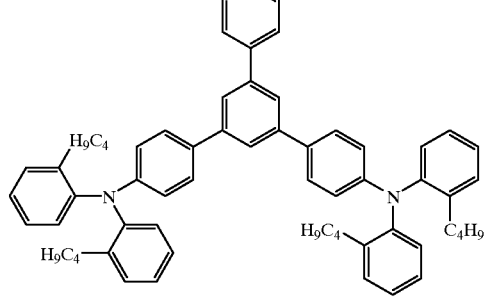

-continued
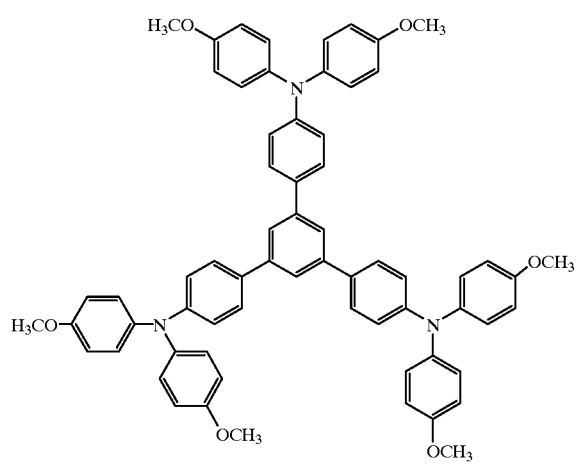
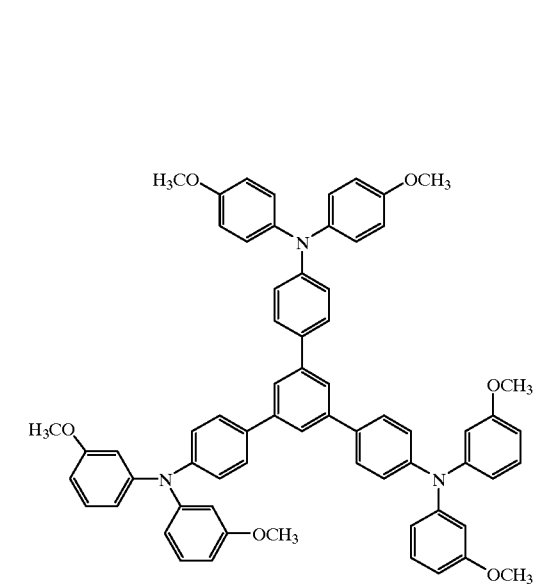
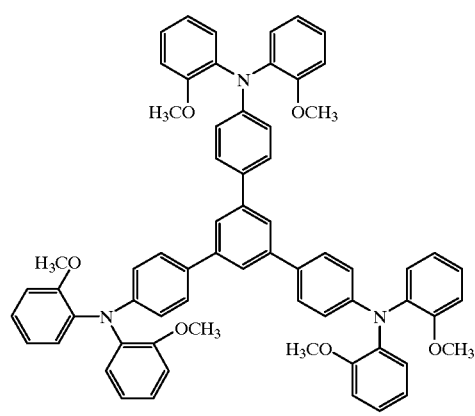
-continued
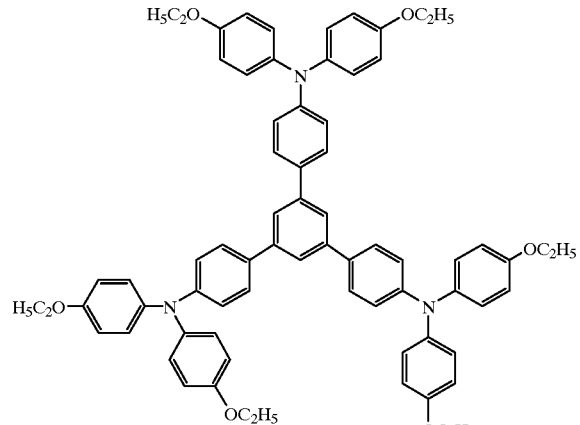
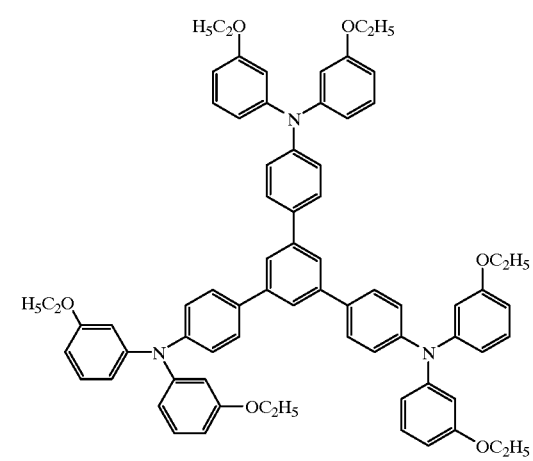
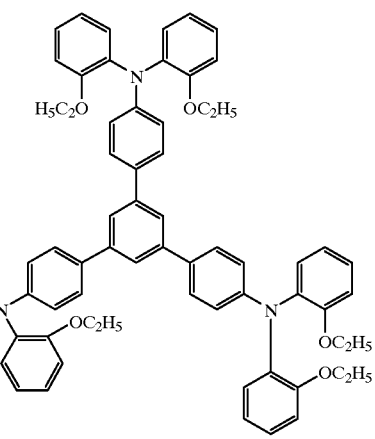

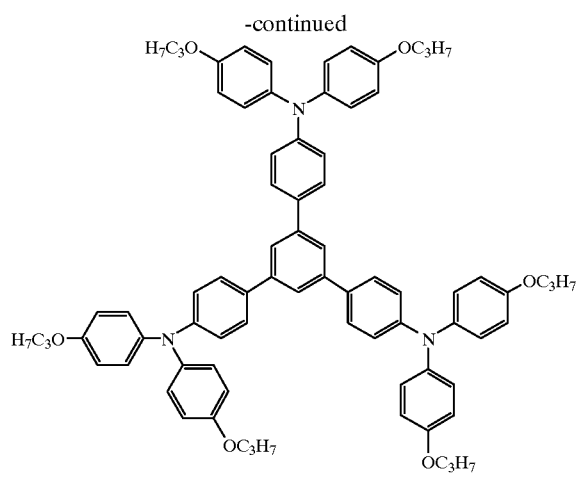
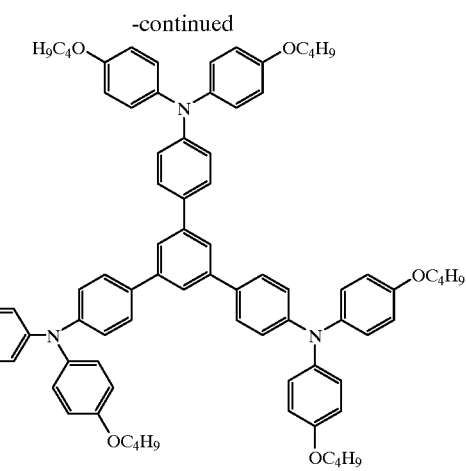
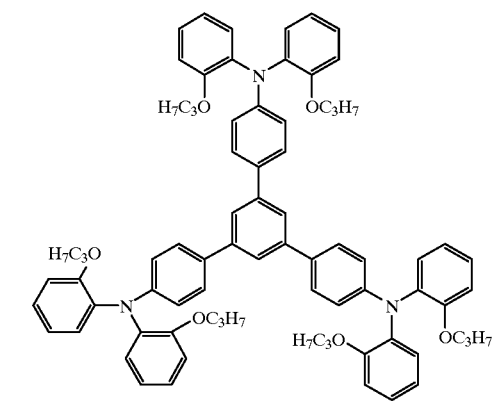

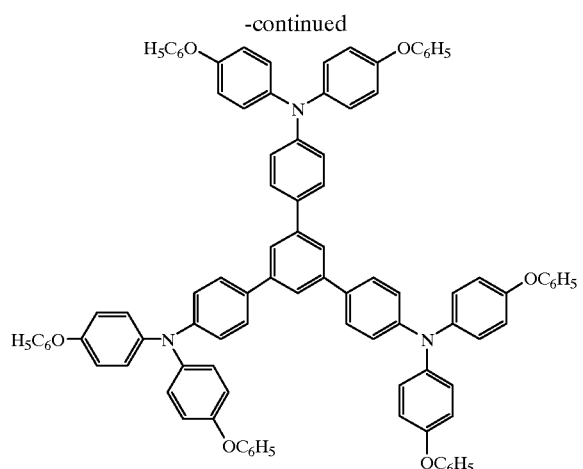
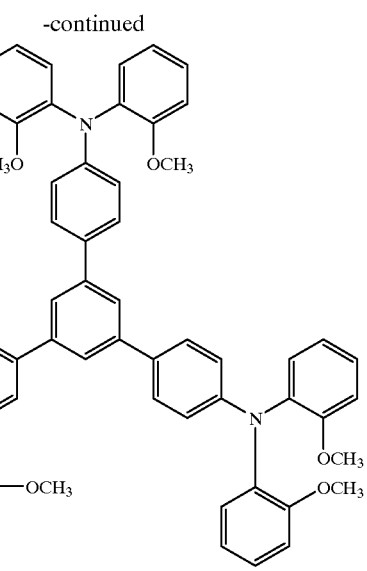
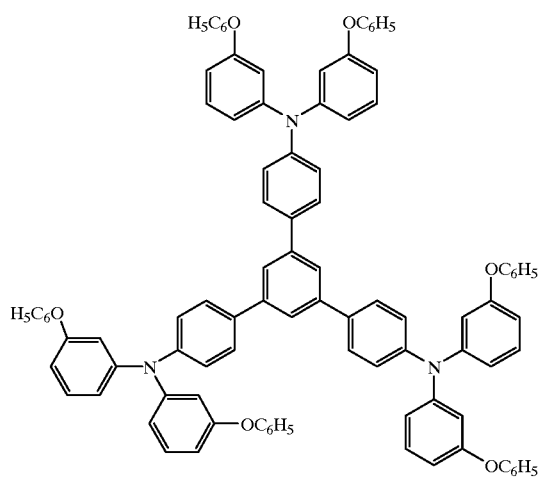
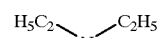
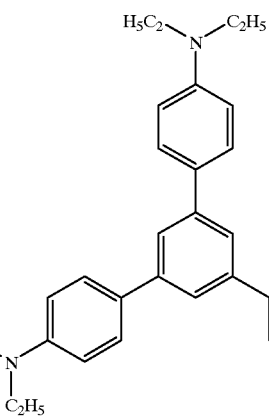
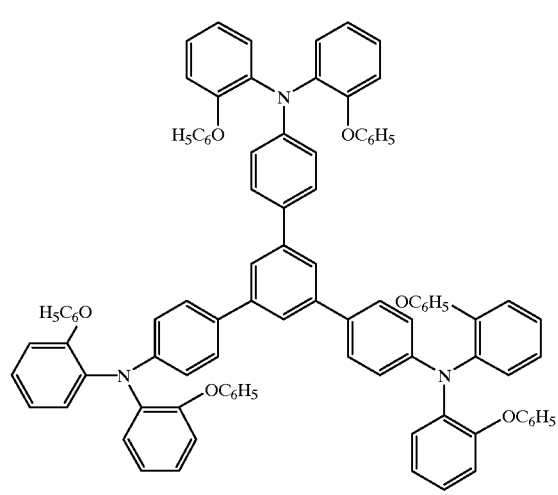
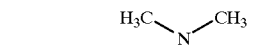
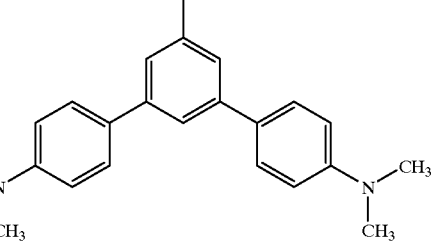

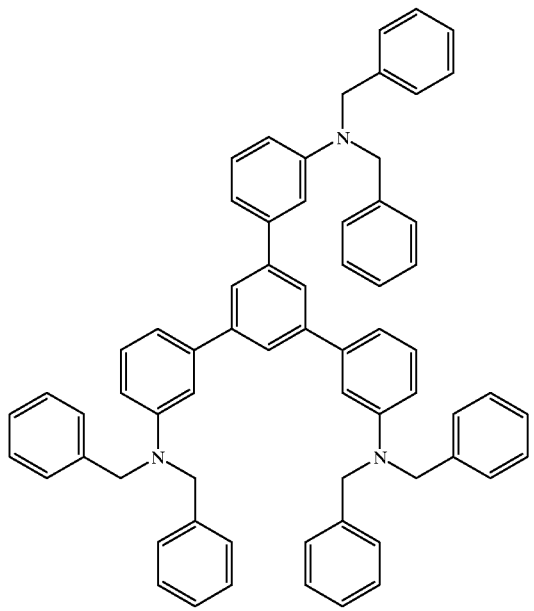

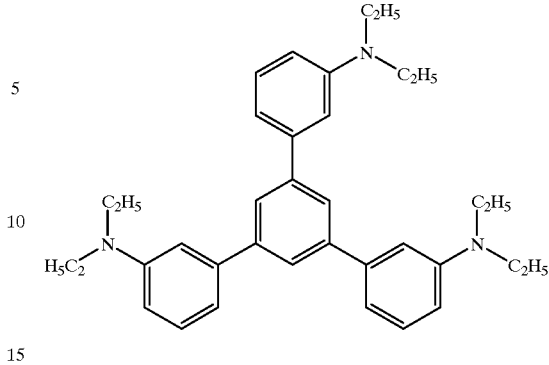

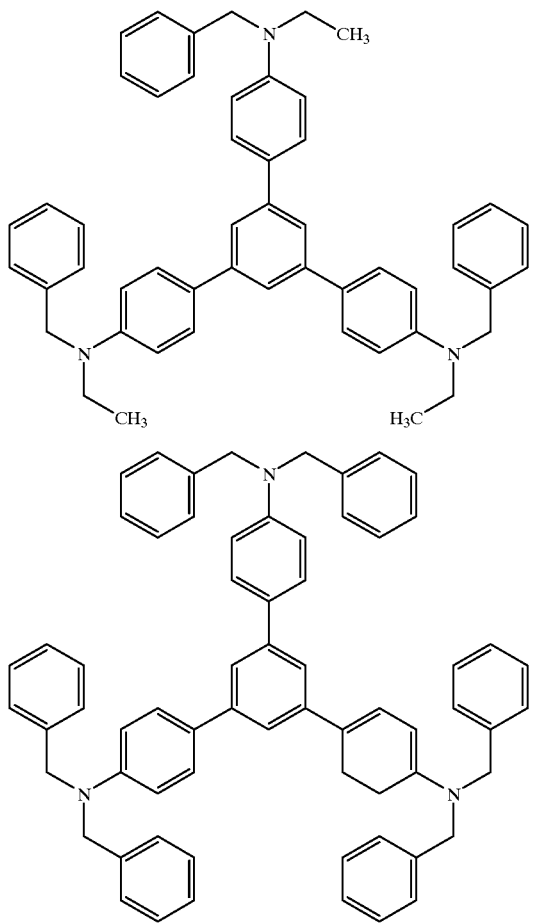

Apart from the component A, it is also possible to use, if desired, further hole conductors, e.g. in the form of a mixture with the component A, to form the electroluminescent element. It is possible to have either one or more compounds of the formula (I), including mixtures of isomers, or mixtures of hole transport compounds with compounds of A, having the general formula (I), of various structures.

A listing of possible hole injection and hole conduction materials is given in EP-A 532 798.

In the case of mixtures of the component A), the compounds can be used in any ratio between 0 and 100% by weight (based on the mixture A)). In a preferred embodiment, use is made of from 1 to 99% by weight and from 99 to 1% by weight, particularly preferably from 5 to 95% by weight and from 95 to 5% by weight. In a further preferred embodiment, use is made of from 30 to 70% by weight and from 70 to 30% by weight.

Examples which may be mentioned are;

Anthracene compounds, e.g. 2,6,9,10-tetraisopropoxyanthracene; oxadiazole compounds, e.g. 2,5-bis(4-diethylaminophenyl)-1,3,4-oxadiazole, triphenylamine compounds, e.g. N,N'-diphenyl-N,N'-di(3-methylphenyl)-1,1'-biphenyl-4,4'-diamine; aromatic tertiary amines, e.g. N-phenylcarbazole, N-isopropylcarbazole and compounds which can be used in hole transport layers, as are described in the Japanese patent application JP-A 62-264 692; also pyrazoline compounds, e.g. 1-phenyl-3-(p-diethylaminostyryl)-5-(p-diethylaminophenyl)-2-pyrazoline; styryl compounds, e.g. 9-(p-diethylaminostyryl)-anthracene; hydrazone compounds, e.g. bis-(4-dimethylamino-2-methylphenyl)-phenyl-methane; stilbene compounds, e.g. -(4-methoxyphenyl)-4-N,N-diphenylamino-(4'-methoxy)stilbene, enamine compounds, e.g. 1,1-(4,4'-diethoxyphenyl)-N,N-(4,4'-dimethoxyphenyl) enamine; metal or nonmetal phthalocyanines and porphyrin compounds.

Preference is given to triphenylamine compounds and/or aromatic tertiary amines, with particular preference being given to the compounds mentioned by way of example.

Materials which have hole-conducting properties and can be used as mixing partners with component A are, for example:

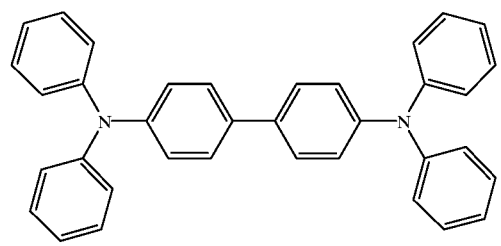
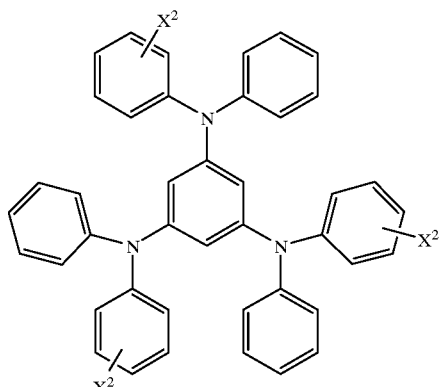
X² = H, CH₃, C₂H₅, OCH₃, OC₂H₅, OC₆H₅
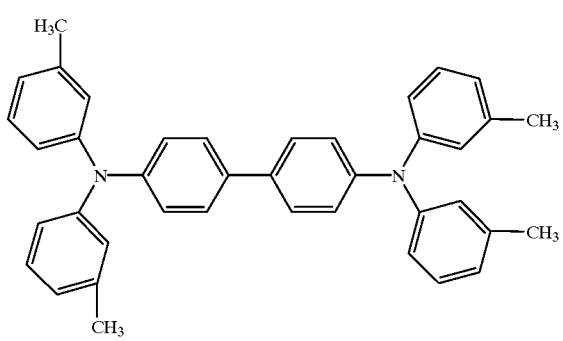
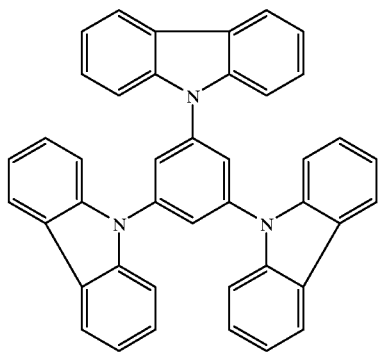
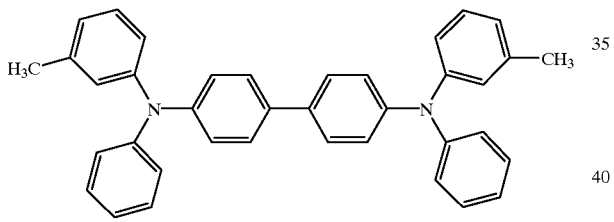
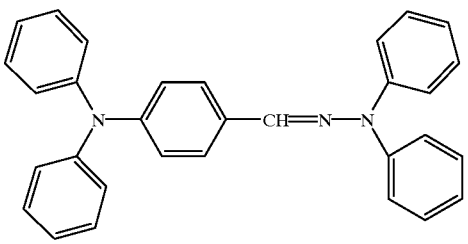
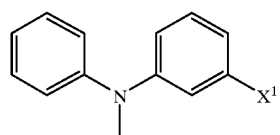
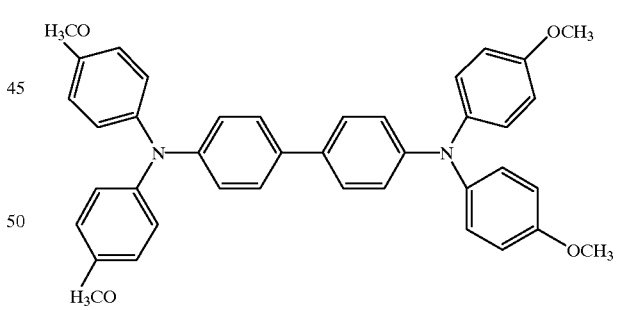
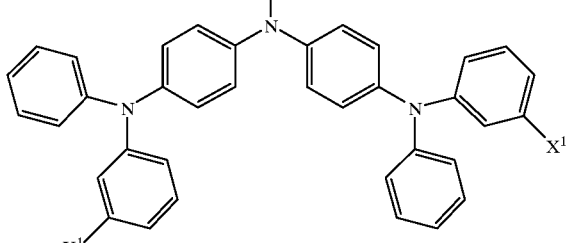
X¹ = H, CH₃, C₂H₅, OCH₃, OC₂H₅, OC₆H₅
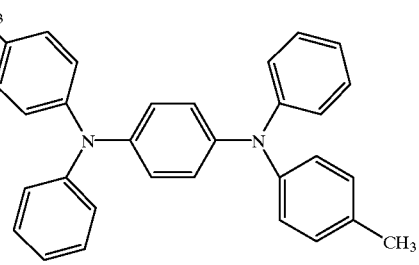

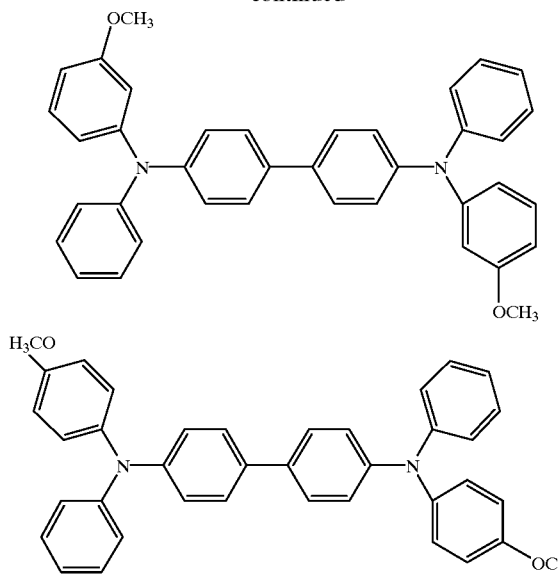

These and further examples are described in J. Phys. Chem. 1993, 97, 6240–6248 and Appl. Phys. Lett., Vol. 66, No. 20, 2679–2681.

The binder C) represents polymers and/or copolymers such as polycarbonates, polyester carbonates, copolymers of styrene such as SAN or styrene acrylates, polysulphones, polymers based on vinyl-containing monomers, e.g. poly(meth)acrylates, polyvinylpyrrolidone, polyvinylcarbazole, vinyl acetate and vinyl alcohol polymers and copolymers, polyolefins, cyclic olefin copolymers, phenoxy resins, etc. It is also possible to use mixtures of various polymers. The polymeric binders C) preferably have molecular weights of from 10,000 to 200,000 g/mol, are soluble and film-forming and are transparent in the visible spectral region. They are described, for example, in Encyclopaedia of Polymer Science and Engineering, $2^{nd}$ ed., A. Wiley-Interscience. They are usually used in an amount of up to 95% by weight, preferably up to 80% by weight, based on the total weight of A) and B).

The component B) represents a compound of the general formula (II)

II-1) $M^+Q$ or $M^+Q'$ where $M^+$=monovalent metal ion, preferably an alkali metal ion, e.g. $Li^+$, $Na^+$ II-2) $M^{2+}Q_2$ or $M^{2+}QQ'$ or $M^{2+}Q'_2$ where $M^{2+}$=divalent metal ion, preferably an alkaline earth metal ion or zinc ion, e.g. $Mg^{2+}$, $Zn^{2+}$ II-3) $M^{3+}Q_3$ or $M^{3+}Q_2Q'$ or $M^{3+}QQ'_2$ or $M^{3+}Q'_3$ where $M^{3+}$=trivalent metal ion, preferably from main group III, e.g. $Al^{3+}$, $Ga^{3+}$, $In^{3+}$ Q and Q' represent ligands of the general formula (III)

(III)

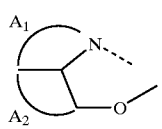

where $A_1$ and $A_2$ are substituted or unsubstituted six-membered aryl rings.

Preferred structure of Q:

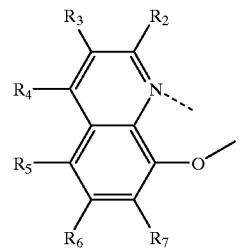

where $R_3$, $R_4$, $R_6$=hydrogen, $R_2$=hydrogen, or in each case substituted or unsubstituted alkyl, aryl, cycloalkyl, heteroaryl, preferably hydrogen or in each case substituted or unsubstituted $(C_1-C_{12})$-alkyl, cyclohexyl, cyclopentyl, phenyl, naphthyl, heteroaryl having from 6 to 12 carbon atoms and nitrogen, oxygen and/or sulphur as heteroatom(s), $R_5$ or $R_7$=in each case substituted or unsubstituted alkanoyl, preferably having from 1 to 20 carbon atoms, cycloalkanoyl, preferably having from 4 to 8, in particular 5 or 6, carbon atoms, araloyl, preferably benzoyl, naphthoyl, or heteroaryloxy having from 6 to 12 carbon atoms and nitrogen, oxygen and/or sulphur as heteroatoms, and the other radical in each case ($R_7$ or $R_5$) is then hydrogen, $R_5$ can also represent di(alkylamino) or di(cycloalkyl)amino or piperidylsulfamoyl.

Preferred structure of Q':

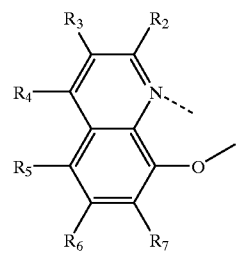

$R_2$, $R_3$, $R_4$, $R_5$, $R_6$=hydrogen $R_7$=halogen- or cyano-substituted or unsubstituted $(C_1-C_{20})$-alkyl, which may also be branched, halogen- or cyano-substituted or unsubstituted $C_5$- or $C_6$-cycloalkyl, halogen- or cyano-substituted or unsubstituted phenyl or naphthyl, halogen- or cyano-substituted or unsubstituted heteroaryl having from 6 to 12 carbon atoms and nitrogen, oxygen and/or sulphur as heteroatom.

It is possible in general to use monovalent, divalent or trivalent metals which are known to form chelates.

II-4) Mixture of the representatives of II-1), II-2) and II-3) in any concentration with and without polymeric binder.

Examples of such compounds are:
Example 1
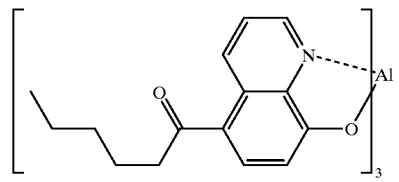
Example 2
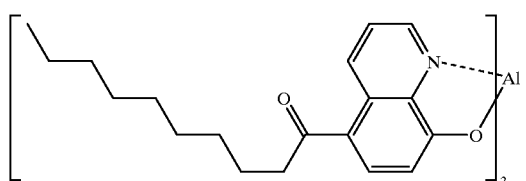
Example 3
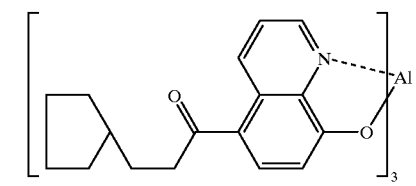
Example 4
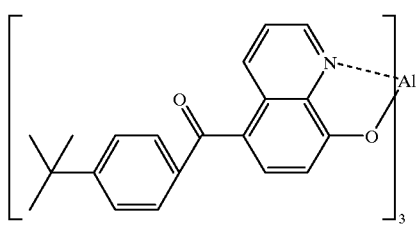
Example 5
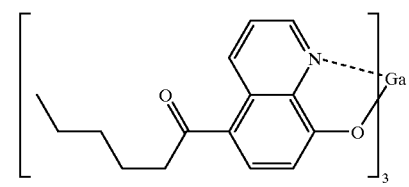
Example 6
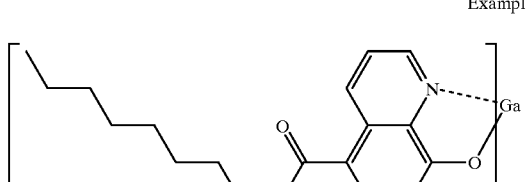
Example 7
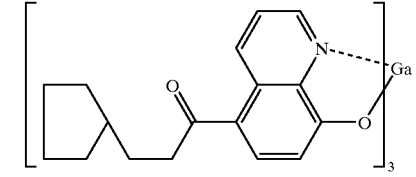
Example 8
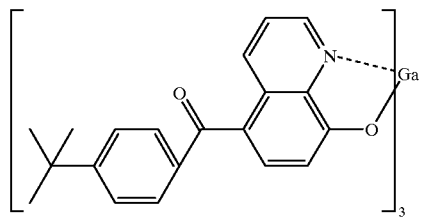
Example 9
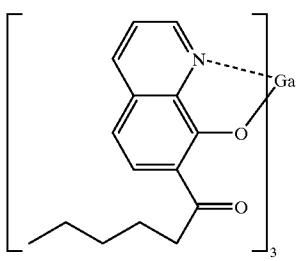
Example 10
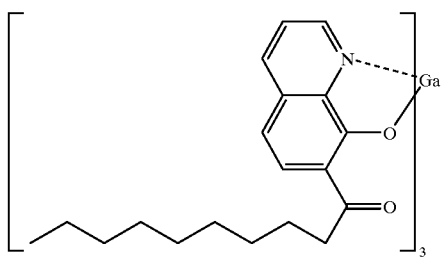
Example 11
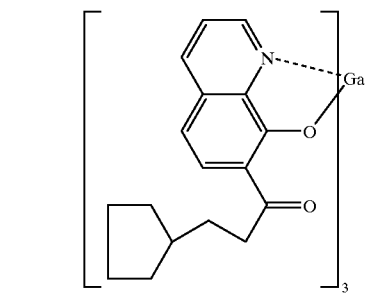
Example 12
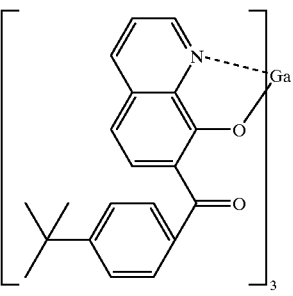
Example 13
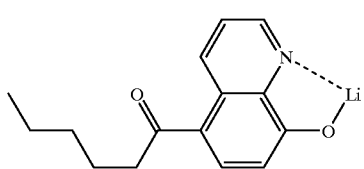

Example 14
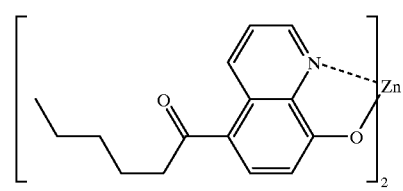
Example 15
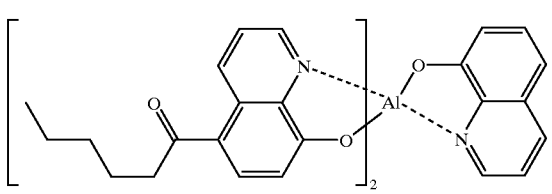
Example 16
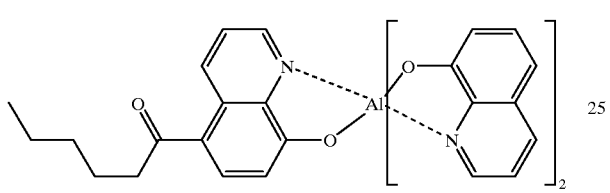
Example 17
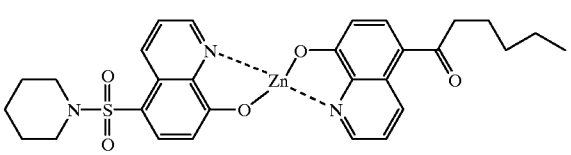
Example 18
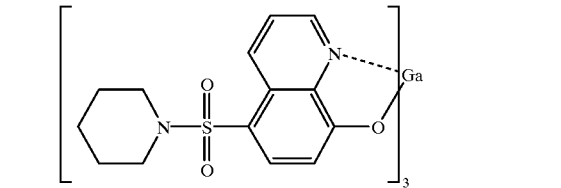
Example 19
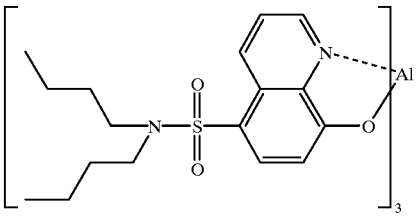
Example 20
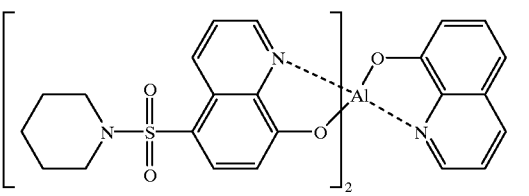
Example 21
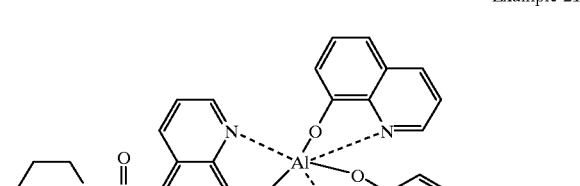
Example 22
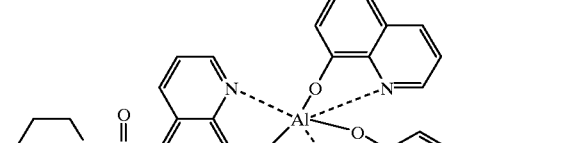
Example 23
Example 24

Example 25
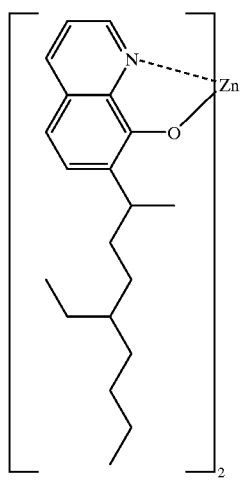
Example 26
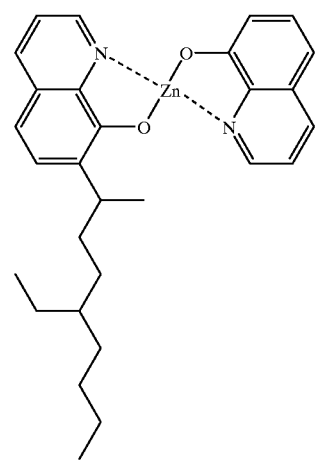
Example 27
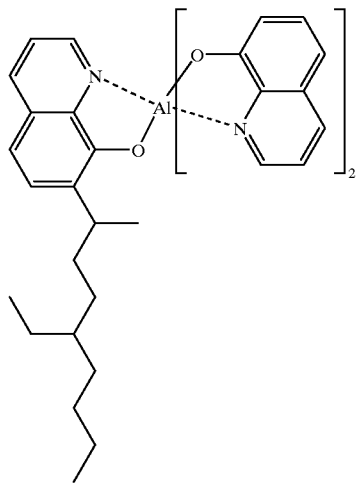
Example 28
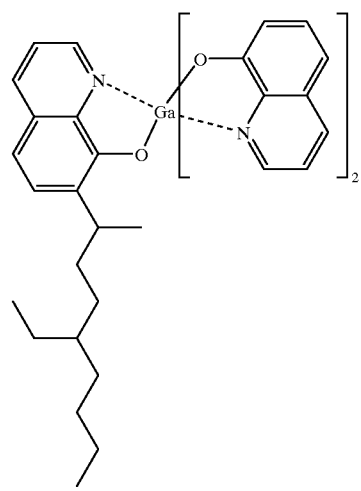
Example 29
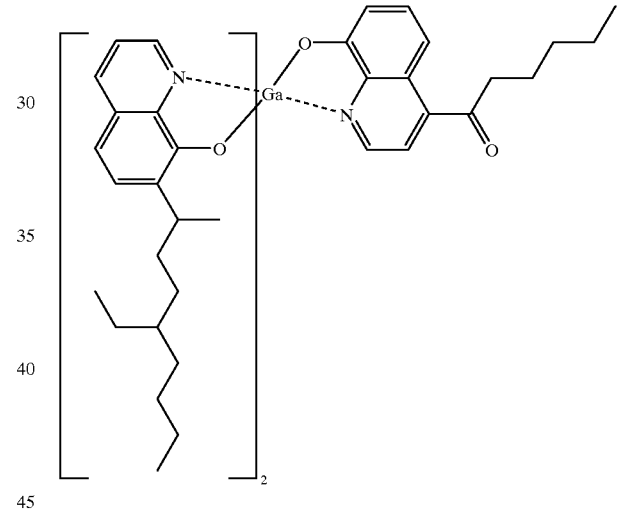
Example 30

Example 31

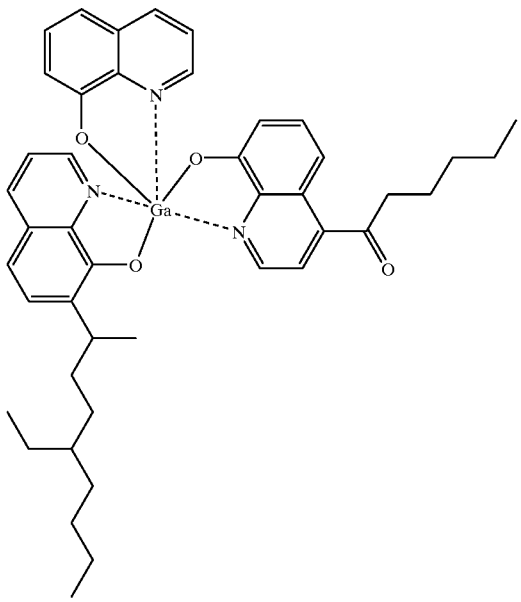

Example 32

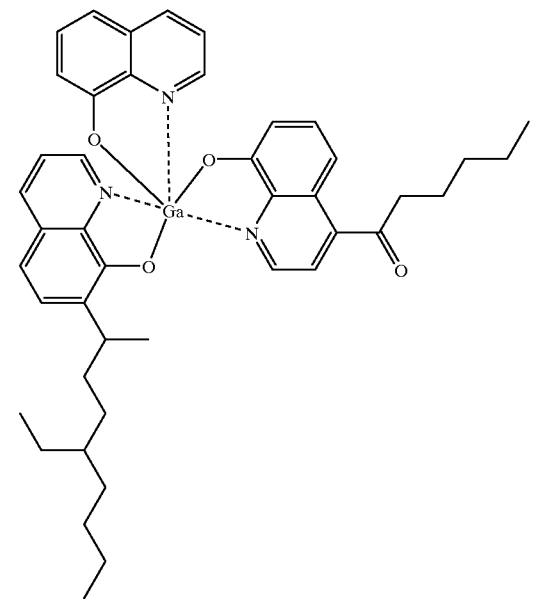

The electroluminescent assemblies of the invention are characterized in that they have a light-emitting layer which contains a mixture of components A) and B) in, if desired, a transparent binder C). Here, the weight ratio of A) and B) can be varied.

The proportion by weight of the sum of the proportions by weight of A) and B) in the polymeric binder is in the range from 0.2 to 98% by weight, preferably from 2 to 95% by weight, particularly preferably from 10 to 90% by weight, very particularly preferably from 10 to 85% by weight.

The weight ratio A:B of the constituents A and B is from 0.05 to 20, preferably from 0.2 to 10 and particularly preferably from 0.3 to 8, in particular from 0.3 to 7. The components A) and B) can consist of either one constituent or a mixture of constituents of any composition.

To produce the layer, the components A), B) and, if desired, C) are dissolved in a suitable solvent and applied to a suitable substrate by casting, doctor blade coating or spin coating. The substrate can be, for example, glass or a plastic material which is supplied with a transparent electrode. As plastic material, it is possible to use, for example, a film of polycarbonate, polyester such as polyethylene terephthalate or polyethylene naphthalate, polysulphone or polyimide.

To produce the layer, the component B) can also be applied separately from solution to an existing layer comprising the components A) and C).

Suitable transparent electrodes are:
a) metal oxides, e.g. indium-tin oxide (ITO), tin oxide (NESA), zinc oxide, doped tin oxide, doped zinc oxide, etc.,
b) semitransparent metal films, e.g. Au, Pt, Ag, Cu etc.,
c) conductive polymer films such as polyanilines, polythiophenes, etc.

The metal oxide electrodes and the semitransparent metal film electrodes are applied as a thin layer by techniques such as vapour deposition, sputtering, platination, etc. The conductive polymer films are applied from solution by techniques such as spin coating, casting, doctor blade coating, etc.

The thickness of the transparent electrode is from 3 nm to a number of $\mu$m, preferably from 10 nm to 500 nm.

The electroluminescent layer is applied as a thin film directly to the transparent electrode or to a charge transport layer which may be present. The thickness of the film is from 10 to 500 nm, preferably from 20 to 400 nm, particularly preferably from 50 to 250 nm.

A further charge transport layer can be inserted on the electroluminescent layer before a counterelectrode is applied.

A listing of suitable intermediate charge transport layers, which can be hole- and/or electron-conducting materials and can be in polymeric or low-molecular weight form, if desired as a blend, is given in EP-A 532 798. Particularly suitable materials are specifically substituted polythiophenes which have whole-transporting properties. They are described, for example, in EP-A 686 662.

The content of low molecular weight hole conductor in a polymeric binder can be varied in the range from 2 to 97% by weight; the content is preferably from 5 to 95% by weight, particularly preferably from 10 to 90% by weight, in particular from 10 to 85% by weight. The hole injection or hole conduction zones can be deposited using various methods.

Film-forming hole conductors can also be used in pure form (100% pure). If desired, the hole injection or hole conduction zone can also contain proportions of an electroluminescent substance.

Film-forming emitters/electron conductors can likewise be used in pure form (100% pure).

Blends consisting exclusively of low molecular weight compounds can be vapour-deposited; soluble and film-forming blends, which may (but not necessarily) contain a binder C) in addition to low molecular weight compounds, can be deposited from solution, e.g. by means of spin coating, casting or doctor blade coating. It is also possible to apply emitting and/or electron conductor substances in a separate layer to the hole conductor layer comprising the component A. Here, an emitting substance can also be added as dopant to the layer containing the compound A and/or B and an electron conductor substance can additionally be applied. An electroluminescent substance can also be added to the electron injection or electron conductor layer.

The content of low molecular weight electron conductors in the polymeric binder can be varied in the range from 2 to 95% by weight; the content is preferably from 5 to 90% by weight, particularly preferably from 10 to 85% by weight. Film-forming electron conductors can also be used in pure form (100% pure).

The counterelectrode comprises a conductive substance which can be transparent. Preference is given to metals, e.g. Al, Au, Ag, Mg, In, etc. or alloys and oxides of these, which can be applied by techniques such as vapour deposition, sputtering and platination.

The assembly of the invention is brought into contact with the two electrodes by means of two electric leads (e.g. metal wires).

On application of a DC potential of from 0.1 to 100 volts, the assemblies emit light having a wavelength of from 200 to 2000 nm. They display photoluminescence in the range from 200 to 2000 nm.

The assemblies of the invention are suitable for producing units for lighting and for display of information.

EXAMPLES

A) Synthesis

Example 1

Ligand synthesis for the example of 5(7)-hexanoyl-8-hydroxyquinoline (Friedel-Crafts acylation)

0.5 mol (66.7 g) of aluminium chloride is dissolved in 150 ml of nitrobenzene and, while stirring, added to 0.2 mol (29.0 g) of 8-hydroxyquinoline dissolved in 50 ml of nitrobenzene. 0.2 mol (26.9 g) of hexanoyl chloride is added dropwise and the mixture is stirred for 10 hours at 80° C. After cooling, the reaction mixture is poured onto 500 g of ice and 20 ml of concentrated hydrochloric acid. After warming, the organic layer is separated off. The nitrobenzene is removed by means of steam, the residue is isolated and treated with saturated sodium acetate solution. The mixture is subsequently extracted with diethyl ether and the solvent is distilled off.

Yields:

5-Hexanoyl-8-hydroxyquinoline 9.2 g (19%)

7-Hexanoyl-8-hydroxyquinoline 13.6 g (28%)

These compounds are separated by chromatography.

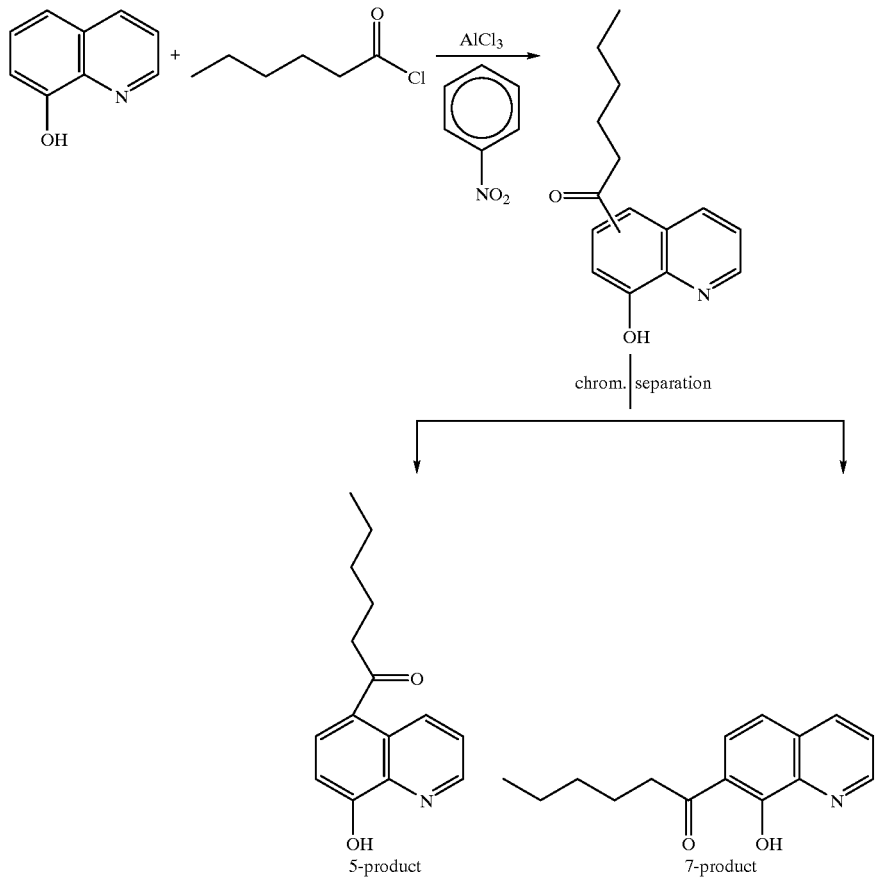

Example 2

Preparation of the metal complexes for the example of tri-(5-hexanoyl-8-hydroxyquinoline)aluminium 10 mmol (2.4 g) of aluminium chloride hexahydrate are dissolved in 50 ml of water. A solution of 30 mmol of 5-hexanoyl-8-hydroxyquinoline (7.3 g) in 50 ml of ethanol is added dropwise. The mixture is heated to 60° C. and the pH is adjusted to 8–9 using 2M potassium carbonate solution. The mixture is then stirred for 1 hour at 70° C. After cooling, the precipitate is isolated, washed with the mother liquor and hot water and subsequently dried in a high vacuum. This gives a green-yellowish substance which displays fluorescence. NMR spectroscopy and elemental analysis demonstrate that it is the desired compound.

Yield: 5.8 g (77%)

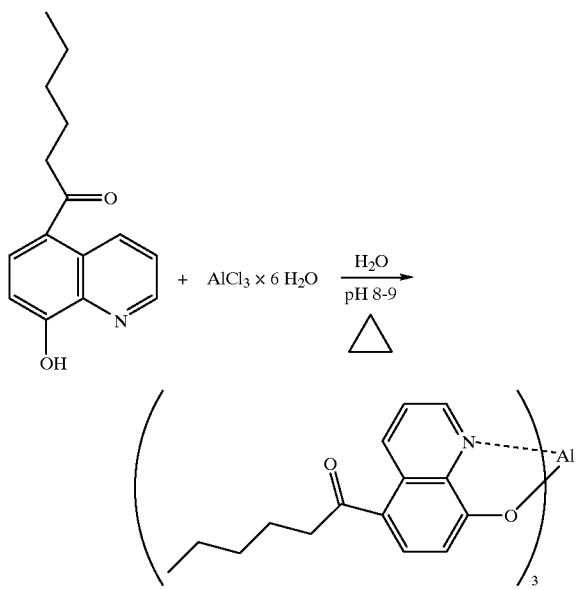

Example 3
Preparation of a gallium complex

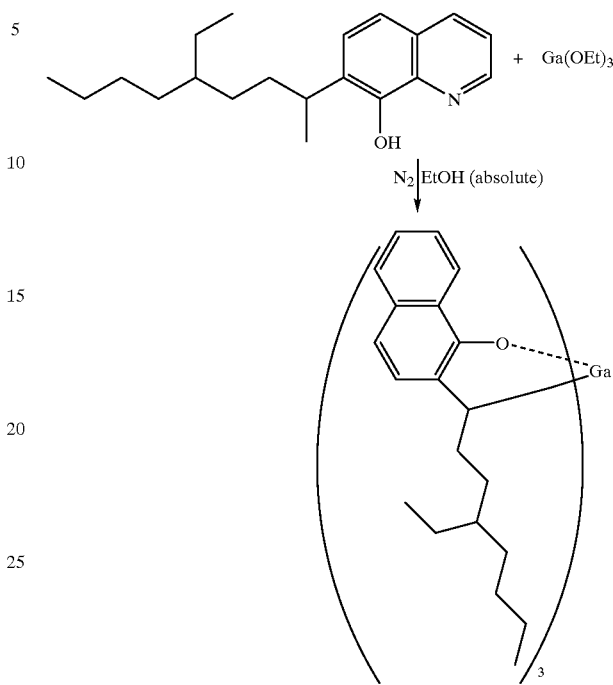

6.28 g (0.021 mol) of 7-(4-ethyl-1-methyloctyl)-8-hydroxyquinoline together with 1.4 g (0.007 mol) of gallium (III) ethoxide are placed in 50 ml of absolute ethanol. While stirring, the reaction mixture is refluxed until virtually complete conversion has taken place according to monitoring by TLC. The solvent is removed to give 6.5 g (0.0067 mol, 96% of theory) of intensively fluorescing Ga complex which is completely soluble in methanol.

Example 4
Preparation of a gallium complex

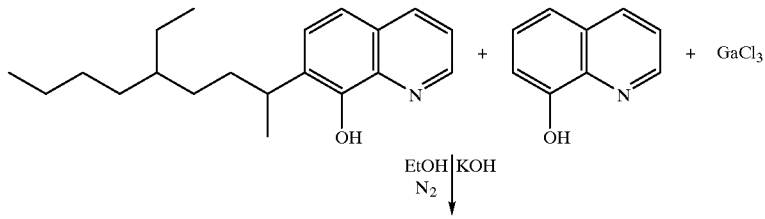

-continued

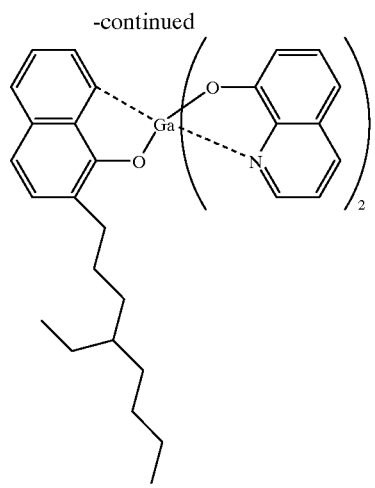

1 g (0.003 mol) of 7-(4-ethyl-1-methyloctyl)-8-hydroxyquinoline together with 0.93 g (0.006 mol) of 8-hydroxyquinoline, 6.28 g of a 9% strength $GaI_3$ solution in methanol and 0.54 g (0.009 mol) of potassium hydroxide are placed in 50 ml of absolute ethanol. The reaction mixture is refluxed for 6 hours. The solvent is removed to give 1.44 g (0.002 mol, 73% of theory) of the intensively fluorescing Ga complex which is completely soluble in methanol.

An electroluminescent assembly based on a blend system of the components A, B and C can be built up from solution on an ITO-coated glass plate by means of a spin coater (cf. for example EP-A 532 798).

As counterelectrode, Mg/Ag in a ratio of 10:1 is applied by thermal codeposition.

After provision of contacts and application of an electric field, the assembly displays visible electroluminescence.

What is claimed is:
1. An electroluminescent assembly comprising:
(a) a substrate;
(b) a first electrode and a second electrode, wherein at least one of the two electrodes is transparent in the visible spectral region; and
(c) an electroluminescent element having:
  (1) at least one selected from the group consisting of a hole injection zone, a hole transport zone, an electroluminescent zone, an electron transport zone, and an electron injection zone, wherein said at least one zone comprises a component A) which is a substituted or unsubstituted 1,3,5-tris(aminophenyl) benzene, and
  (2) a luminescent component B) selected from the group consisting of:

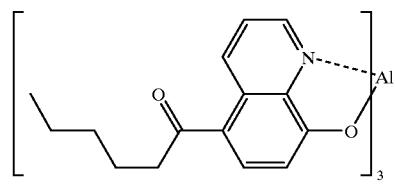

-continued

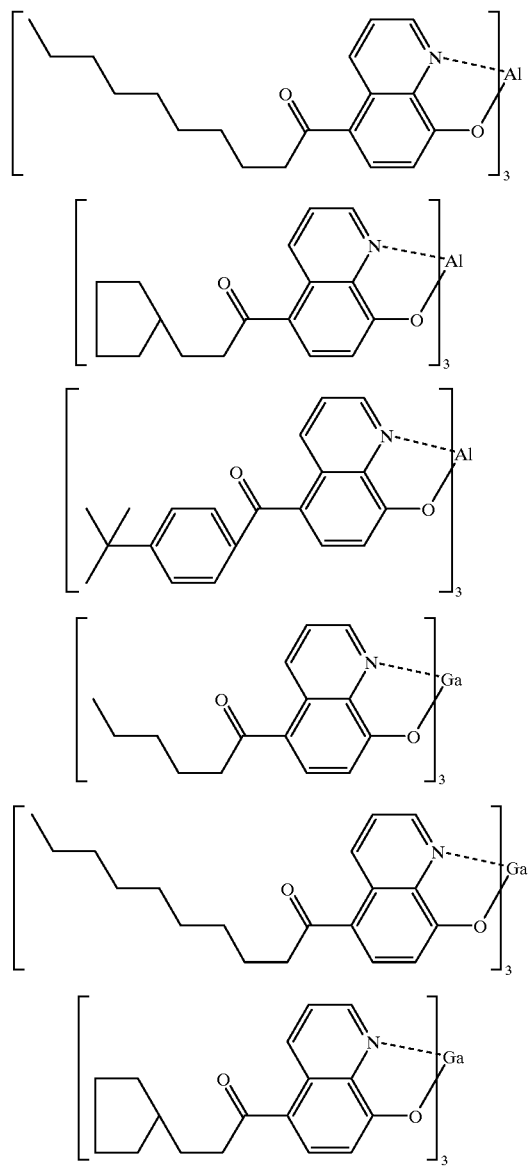

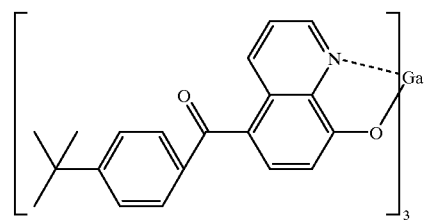
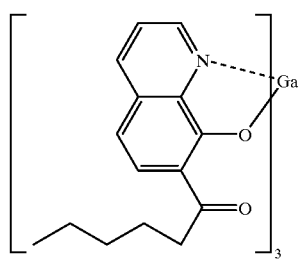
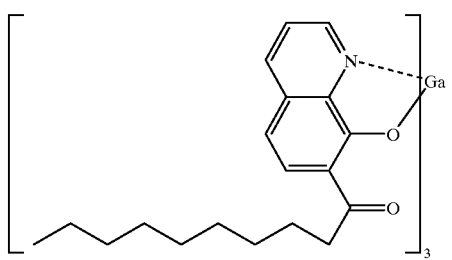
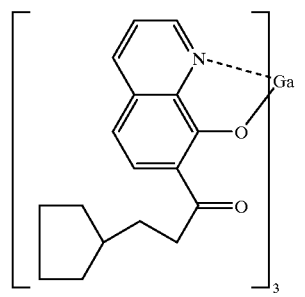
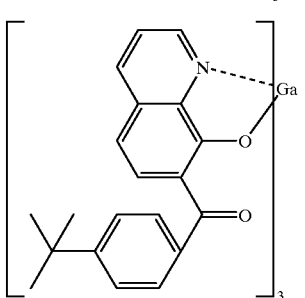
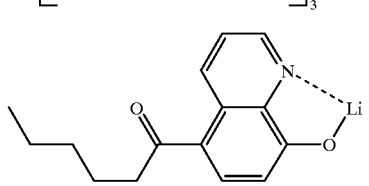
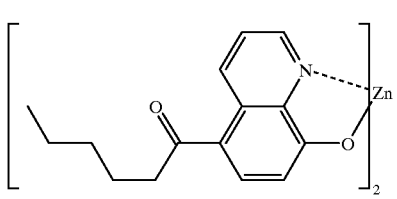
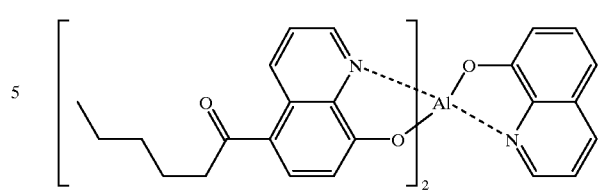
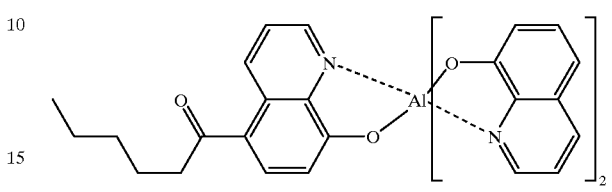
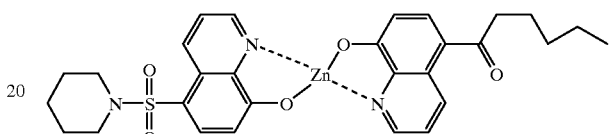
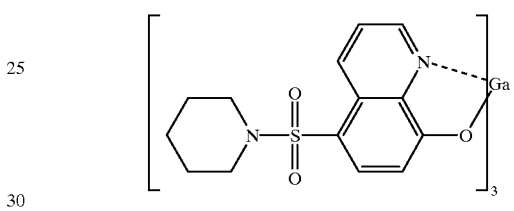
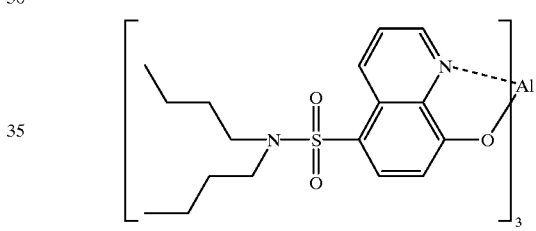
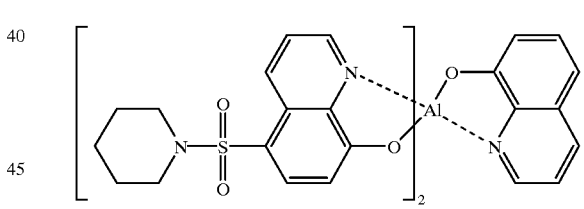
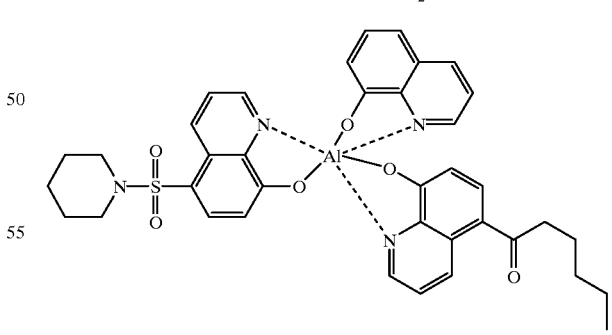
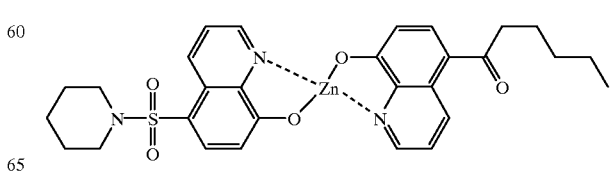

37
-continued
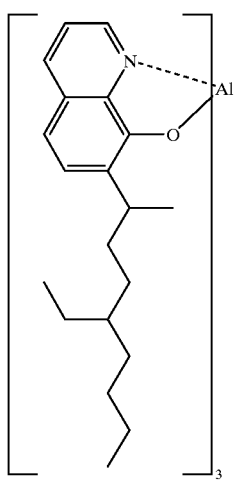
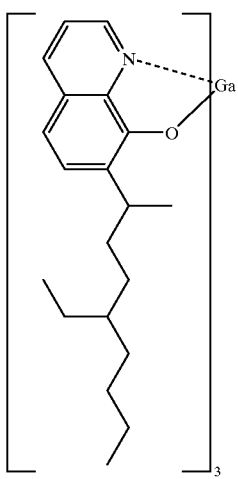
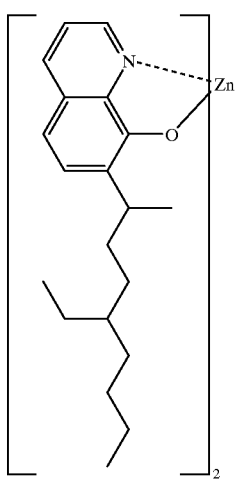
38
-continued
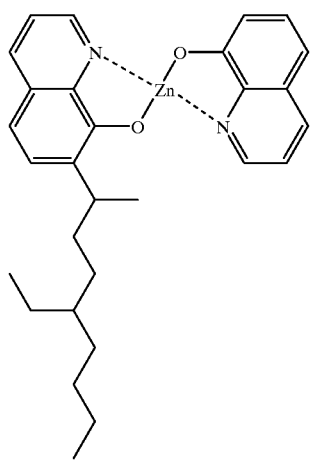
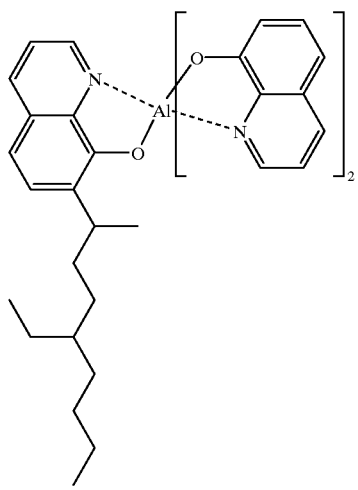
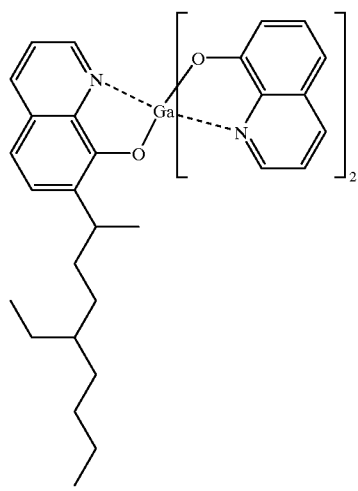

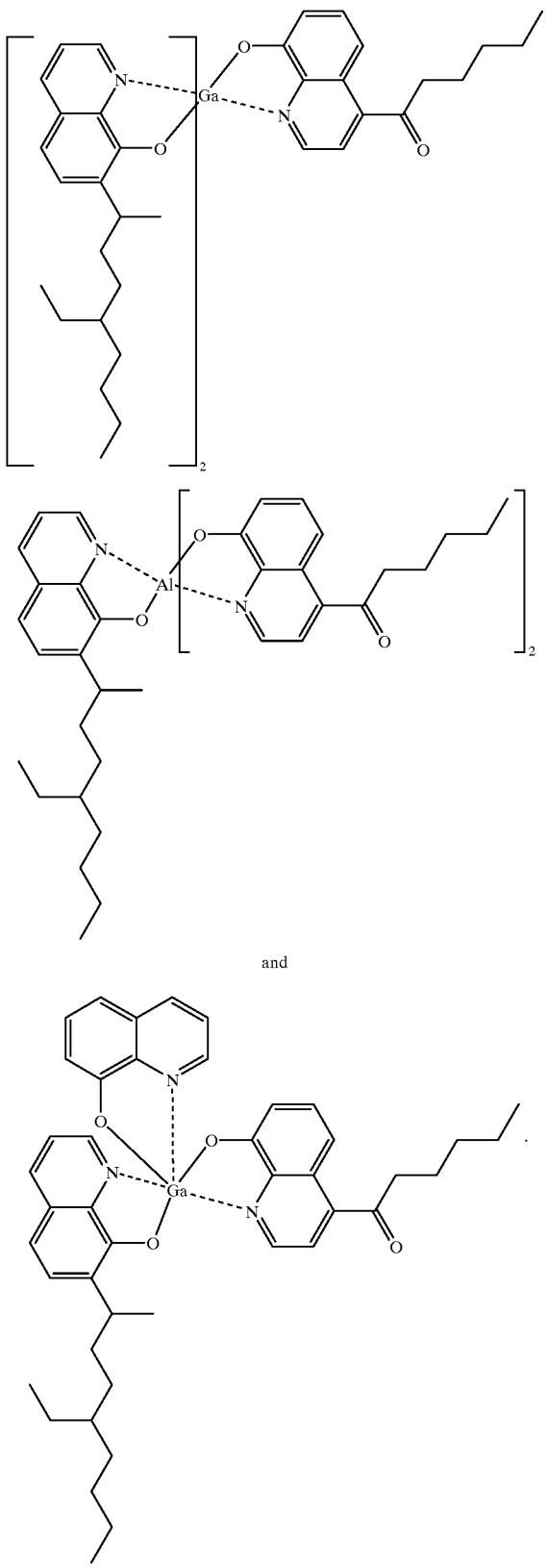

and

2. The electroluminescent assembly of claim 1, wherein the electroluminescent element further comprises a transparent polymeric binder component C).

3. The electroluminescent assembly of claim 2, wherein said transparent polymeric binder component C) is selected from the group consisting of polycarbonates, polyester carbonates, copolymers of styrene, polysulfones, polymers prepared from monomers containing vinyl groups, polyolefins, cyclic olefin copolymers, phenoxy resins, and mixtures thereof.

4. The electroluminescent assembly of claim 2, wherein the proportion by weight of the sum of the proportions by weight of the components A) and B) in the transparent polymeric binder component C) is from about 0.2% to 98% by weight, based on 100% by weight of the components A), B), and C), and wherein the weight ratio of the component A) to the component B) is from about 0.05 to 20.

5. The electroluminescent assembly of claim 2, wherein said transparent polymeric binder component C) is soluble, film-forming, and transparent in the visible spectral region.

6. The electroluminescent assembly of claim 2, comprising up to 95% by weight, based on the total weight of the components A) and B), of said transparent polymeric binder component C).

7. The electroluminescent assembly of claim 1, wherein said component A) is an aromatic tertiary amino compound having the formula (I):

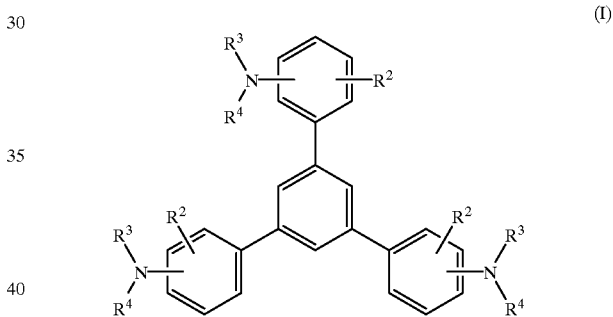

(I)

in which:
(a) $R^2$ represents a hydrogen, a substituted alkyl group, an unsubstituted alkyl group, or a halogen, and
(b) $R^3$ and $R^4$ independently represent, a substituted $C_1$–$C_{10}$-alkyl group, an unsubstituted $C_1$–$C_{10}$-alkyl group, an alkoxycarbonyl-substituted $C_1$–$C_{10}$-alkyl group, and in each case a substituted aryl group, a substituted aralkyl group, a substituted cycloalkyl group, an unsubstituted aryl group, an unsubstituted aralkyl group, or an unsubstituted cycloalkyl group.

8. The electroluminescent assembly of claim 7, containing the tertiary amino compound having the formula (I), wherein:
(a) $R^2$ represents a hydrogen or a $C_1$–$C_6$ alkyl group, and
(b) $R^3$ and $R^4$ represent, independently of one another, a $C_1$–$C_6$-alkyl group, $C_1$–$C_4$-alkoxycarbonyl-$C_1$–$C_6$-alkyl group, and in each case an unsubstituted or a $C_1$–$C_4$-alkyl- and/or $C_1$–$C_4$-alkoxy-substituted phenyl group, a naphthyl group, a phenyl-$C_1$–$C_4$-alkyl group, a naphthyl-$C_1$–$C_4$-alkyl group, a cyclopentyl group, or a cyclohexyl group.

9. The electroluminescent element of claim 1, wherein said component A) is selected from the group consisting of:

41
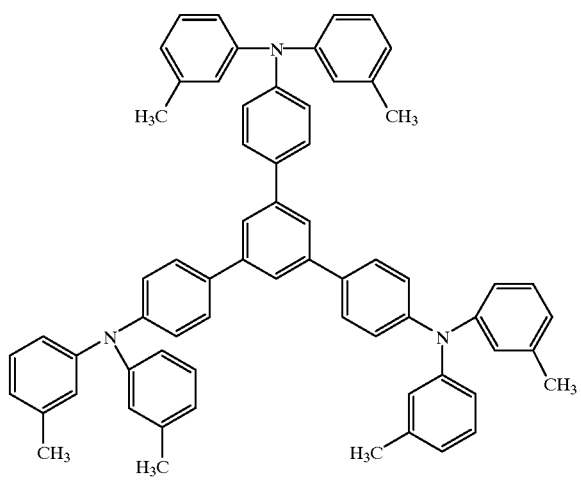
42
-continued
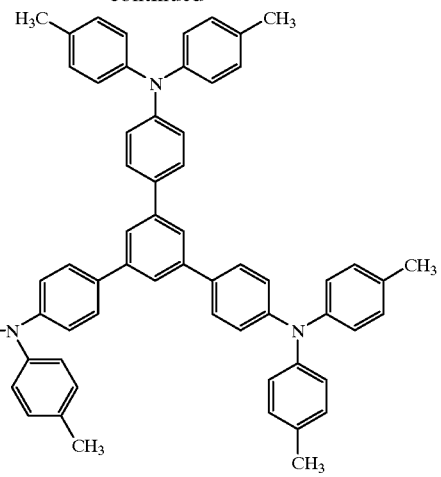
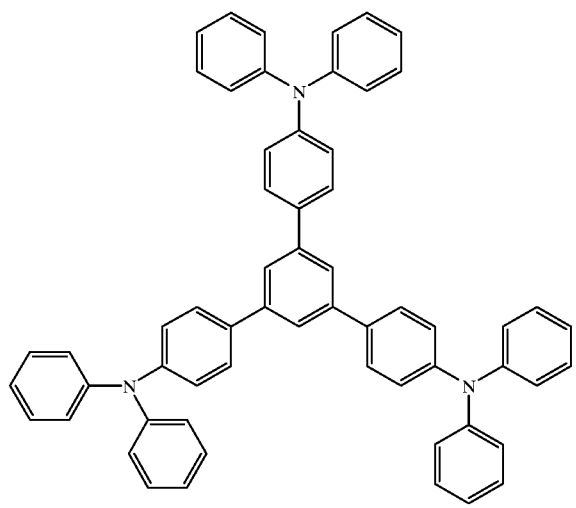
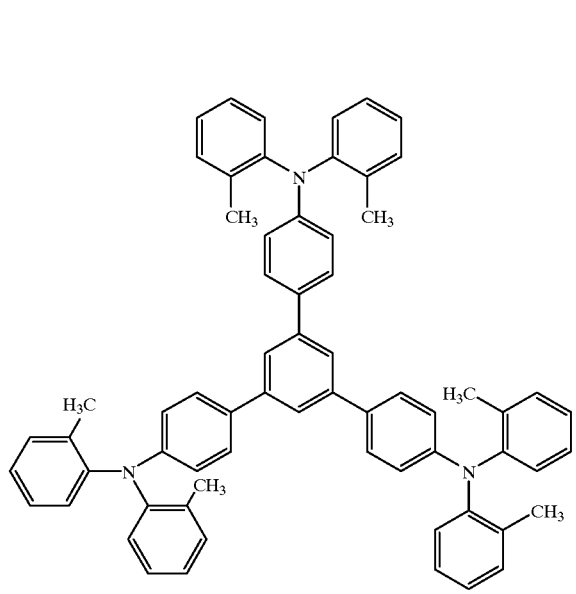
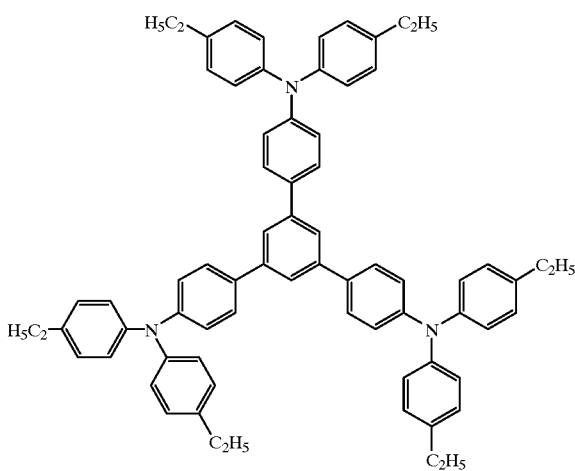

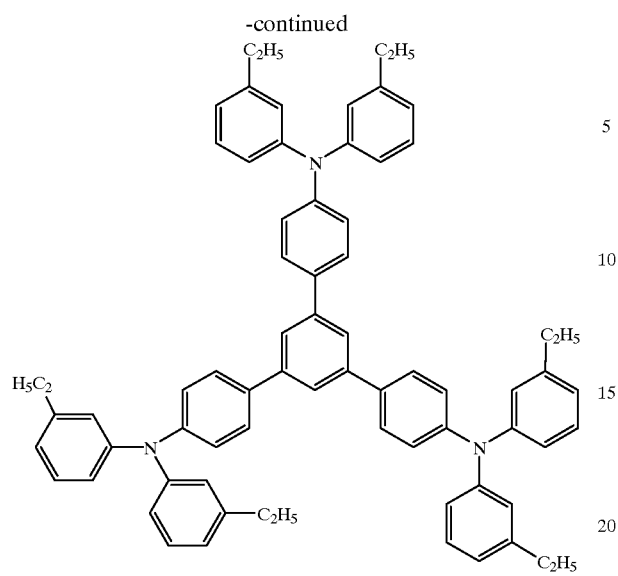
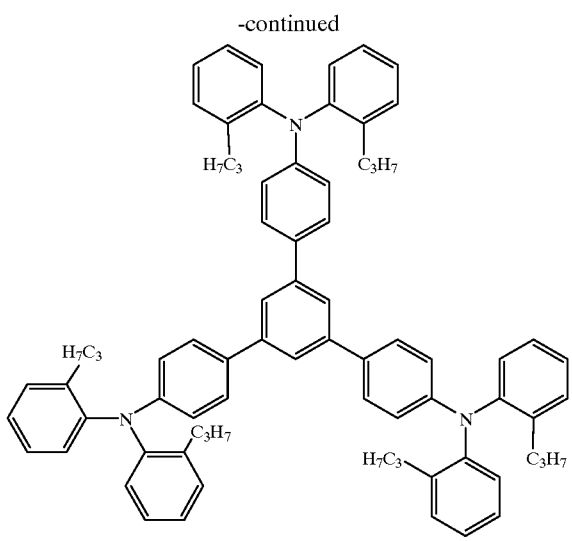
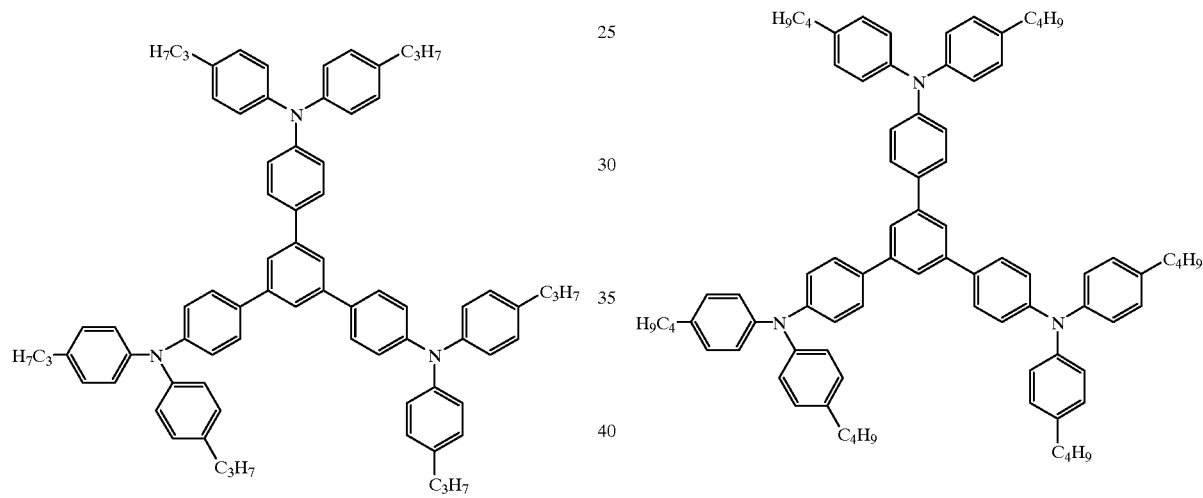
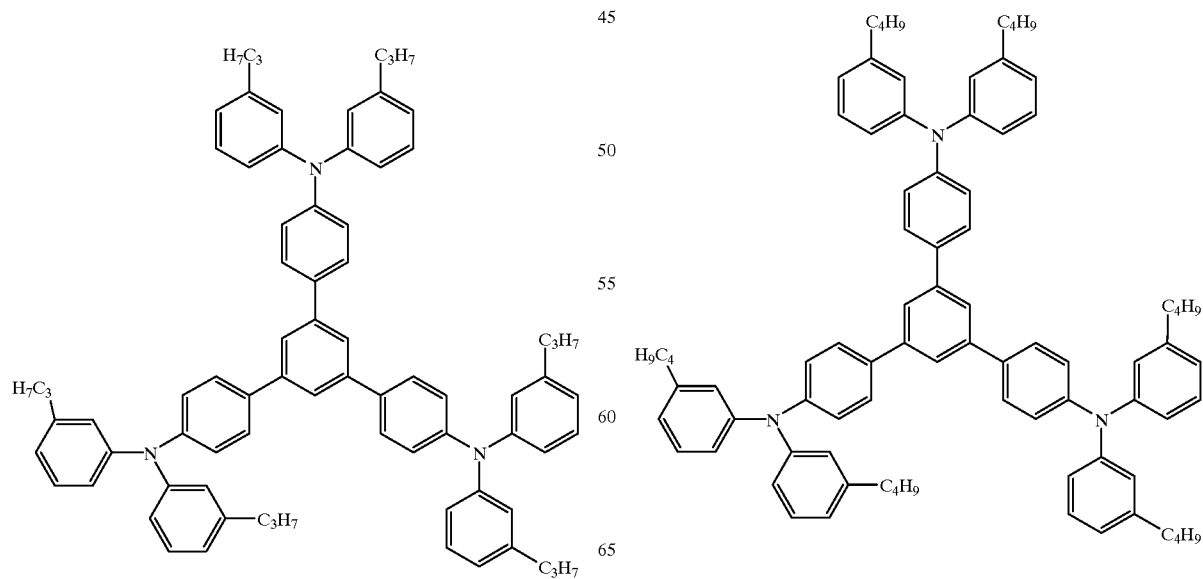

45
-continued
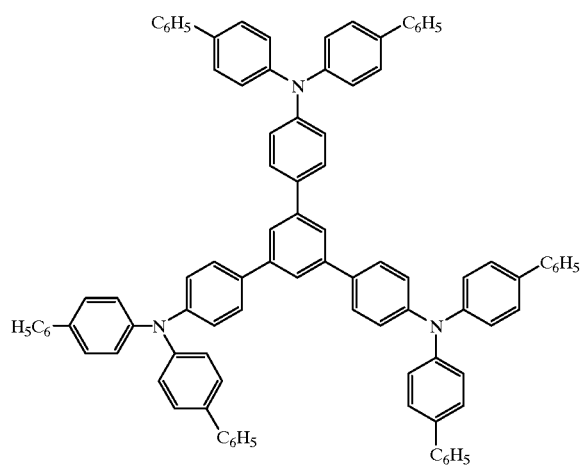
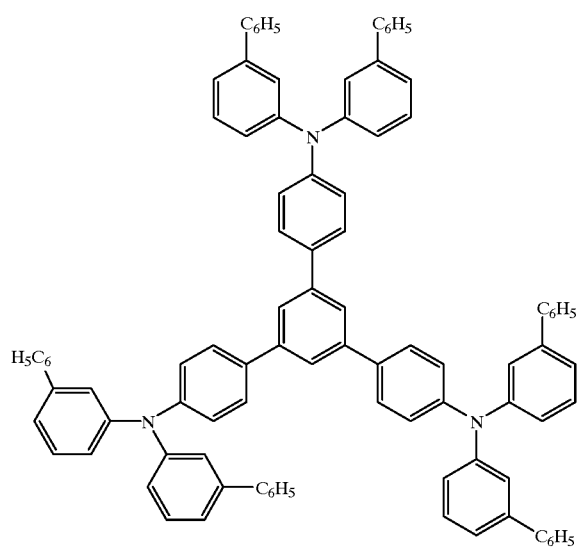
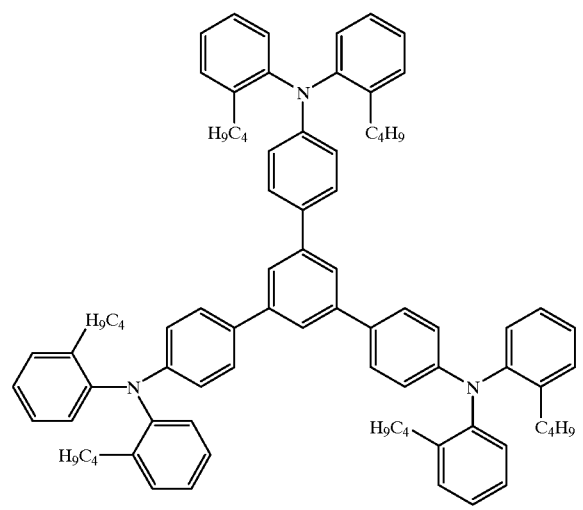
46
-continued
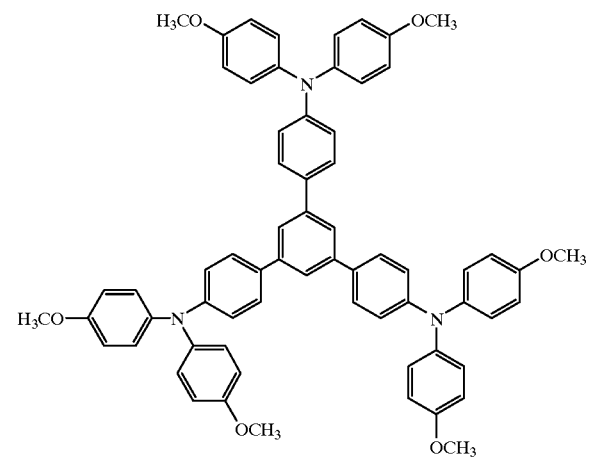
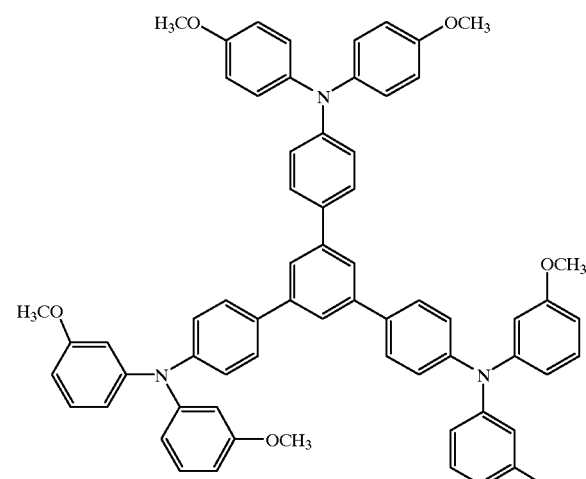
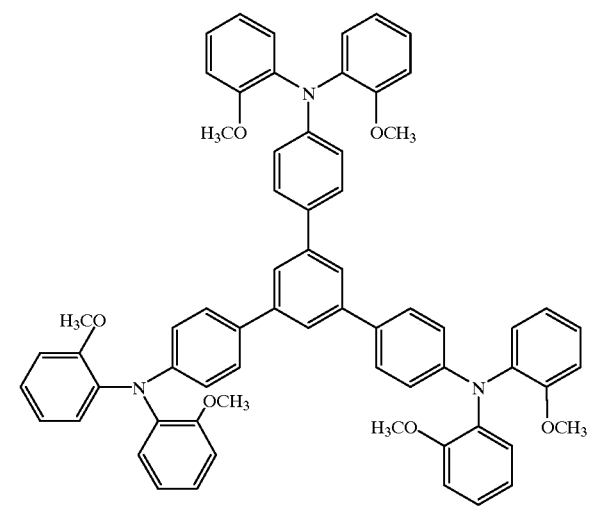

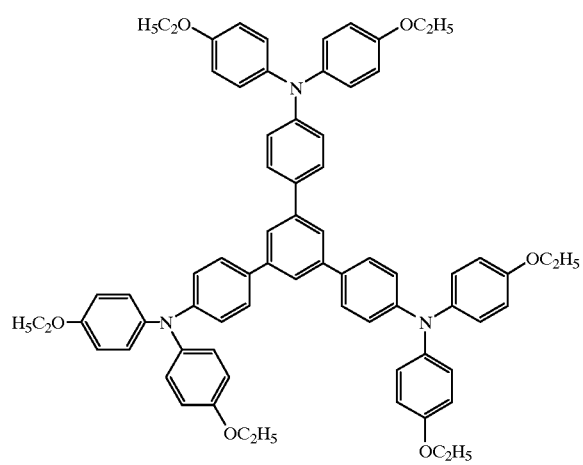
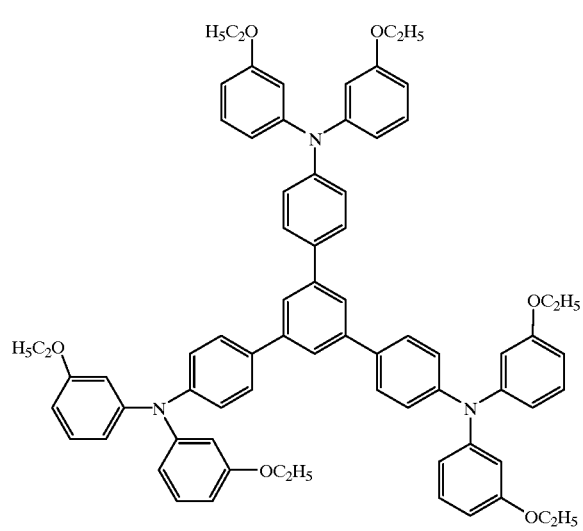
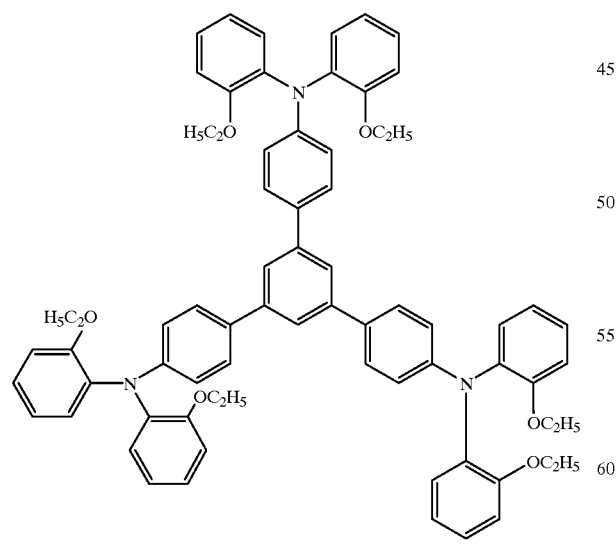
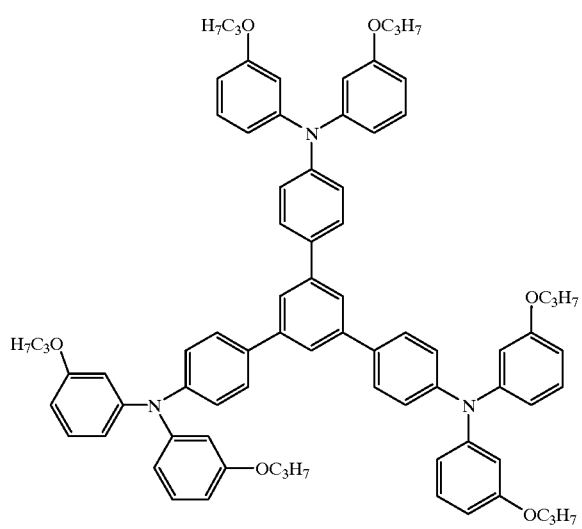
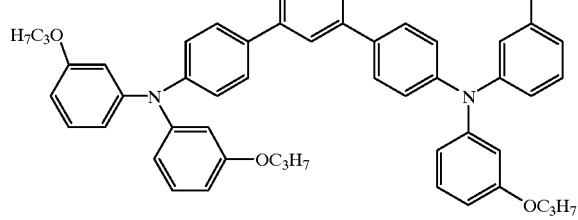
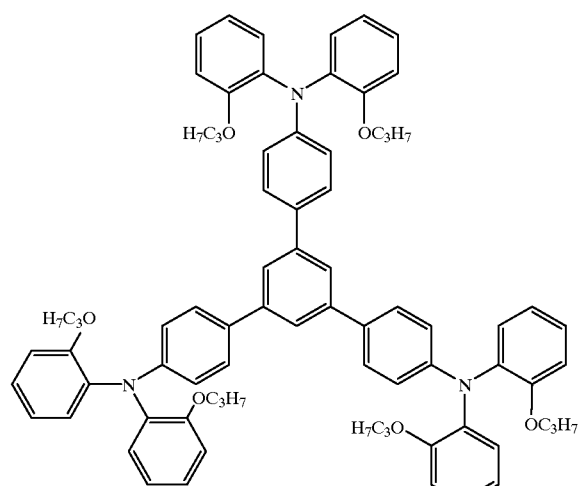

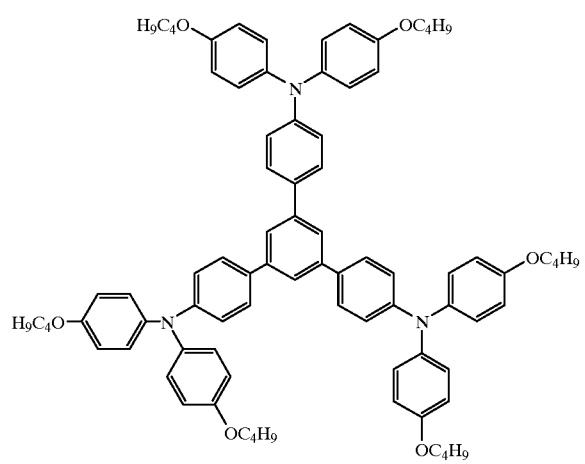
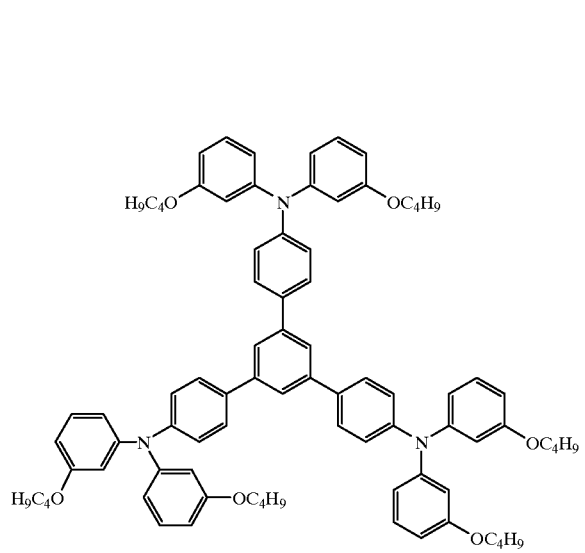
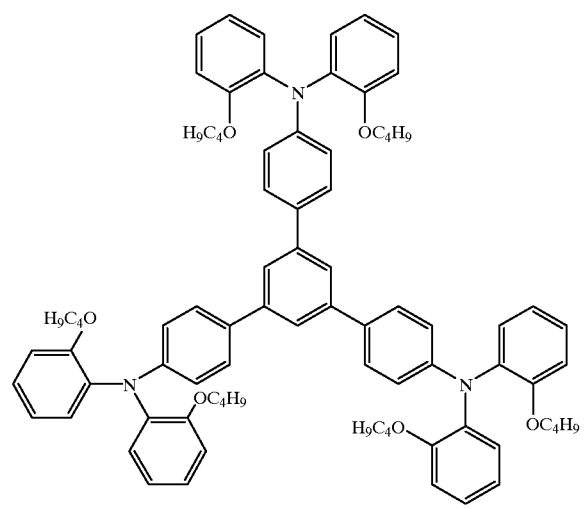
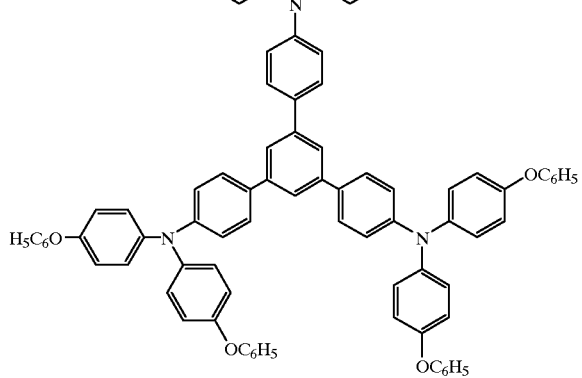
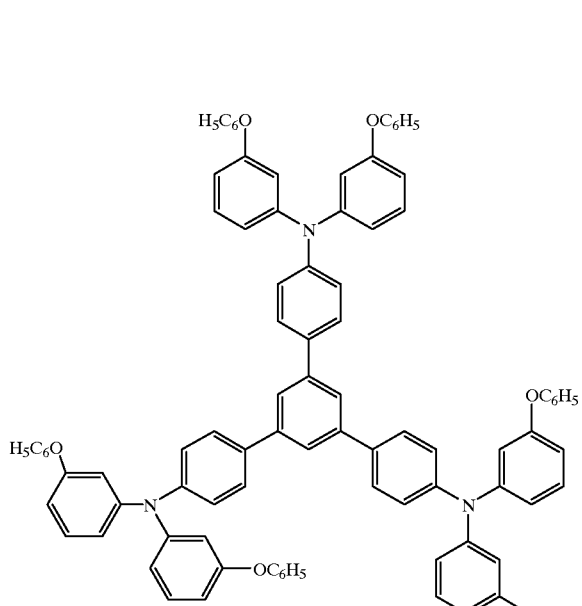

51
-continued
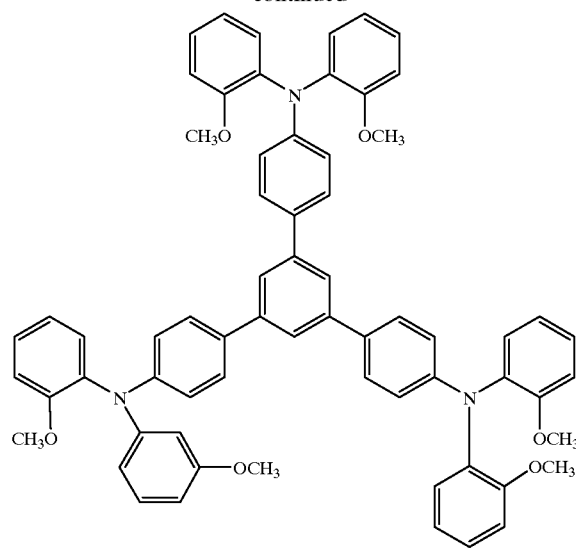
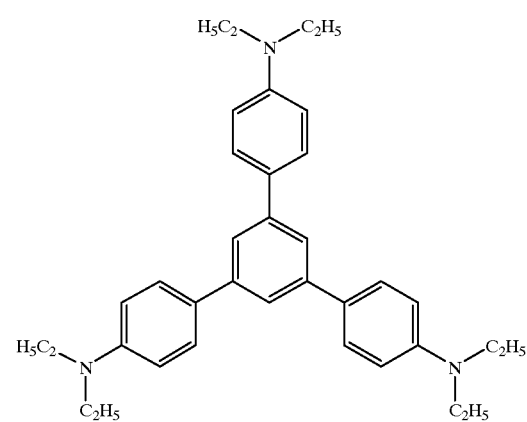
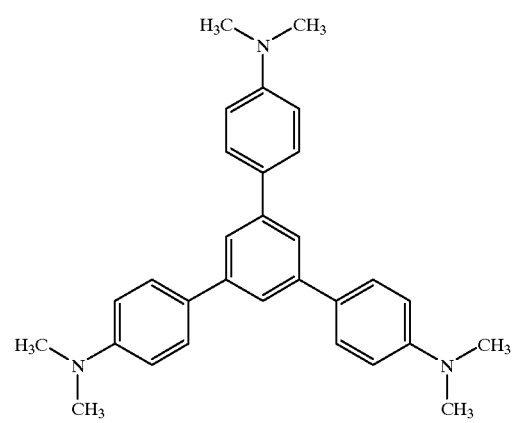
52
-continued
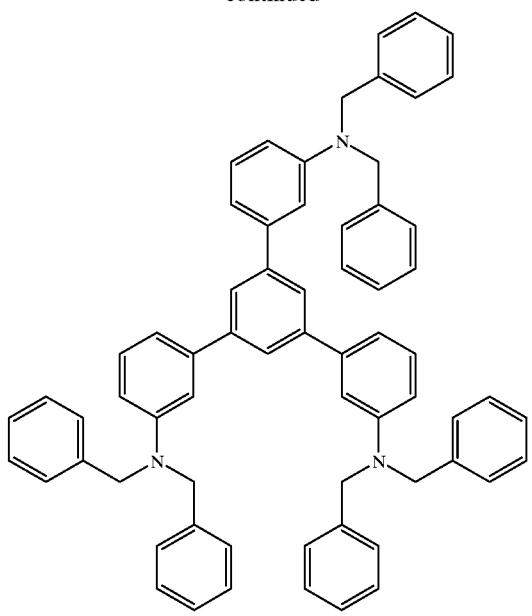
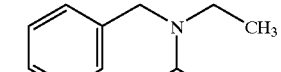
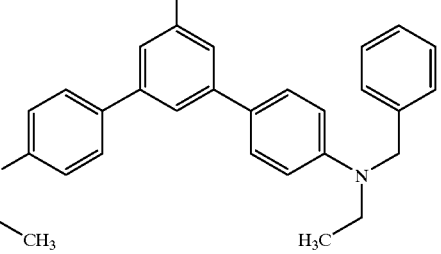
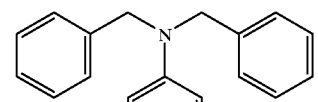
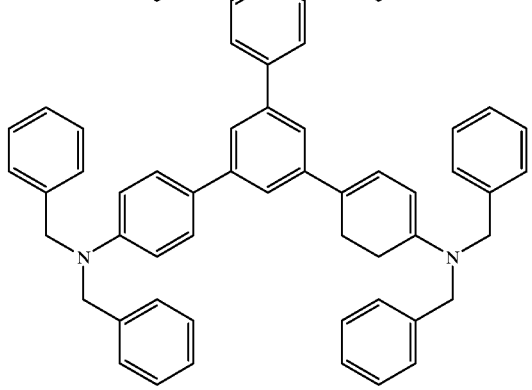

-continued

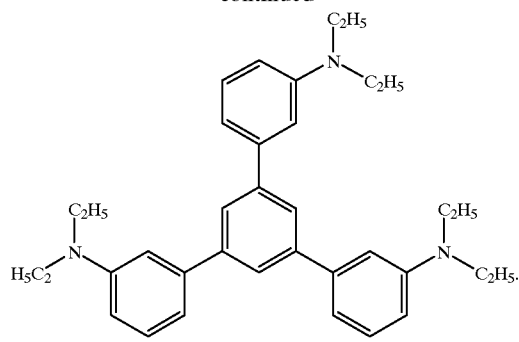

10. The electroluminescent assembly of claim 1, wherein said electroluminescent element further comprises a charge transport substance, and wherein said charge transport substance is at least one substance selected from the group consisting of a hole conductor material and an electron conductor material.

11. The electroluminescent assembly of claim 1 wherein the electroluminescent element consists of one zone and said electroluminescent assembly forms a single-layer system, and wherein said one zone comprises the components A) and B).

12. The electroluminescent assembly of claim 11, wherein said one zone further comprises a transparent polymeric binder component C).

13. The electroluminescent assembly of claim 1 comprising an emitting and electron conductor zone and a hole conductor zone, wherein said emitting and electron conductor zone comprises the component B), and wherein the hole conductor zone comprises component A).

14. A lighting or backlighting article of manufacture, an informational display, a segment, or a matrix display comprising the electroluminescent assembly of claim 1.

15. The electroluminescent assembly of claim 1, further comprising a means for effecting electrical contact between said electroluminescent element and said two electrodes.

16. The electroluminescent assembly of claim 1, wherein said substrate comprises glass or plastic.

17. An electroluminescent assembly comprising a substrate, a first electrode, a second electrode, and an electroluminescent element, wherein said electroluminescent element consists essentially of one zone, and wherein said one zone comprises a substituted or unsubstituted 1,3,5-tris(aminophenyl) benzene compound, a tri-(5-hexanoyl-8-hydroxyquinoline)-aluminum, and a polyvinylcarbazole.

* * * * *

UNITED STATES PATENT AND TRADEMARK OFFICE
CERTIFICATE OF CORRECTION

PATENT NO. : 6,277,504 B1
DATED : August 21, 2001
INVENTOR(S) : Friedrich Koch, Helmut Werner Heuer, Rolf Wehrmann, Martin Deussen and Andreas Elschner It is certified that error appears in the above-identified patent and that said Letters Patent is hereby corrected as shown below:

Column 33,
Line 50, after "at least one" insert -- zone --.

Signed and Sealed this

Twenty-third Day of April, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO. : 6,277,504 B1
DATED : August 21, 2001
INVENTOR(S) : Friedrich Koch, Helmut Werner Heuer, Rolf Wehrmann, Martin Deussen and Andreas Elschner It is certified that error appears in the above-identified patent and that said Letters Patent is hereby corrected as shown below:

Column 32,
Lines 12-30 (Example 3), replace

" 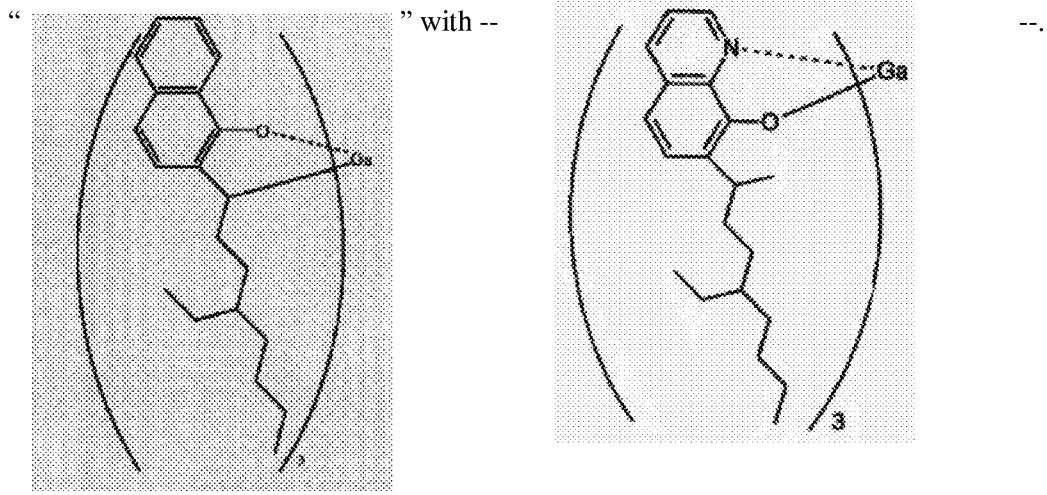 " with --  --.

Signed and Sealed this

Sixteenth Day of July, 2002

Attest:

Attesting Officer

JAMES E. ROGAN
Director of the United States Patent and Trademark Office